United States Patent
Komatsu

(10) Patent No.: US 9,196,566 B2
(45) Date of Patent: Nov. 24, 2015

(54) SEMICONDUCTOR DEVICE AND SEMICONDUCTOR DEVICE FABRICATION METHOD

(71) Applicant: FUJI ELECTRIC CO., LTD., Kawasaki-shi (JP)

(72) Inventor: Kousuke Komatsu, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/482,326

(22) Filed: Sep. 10, 2014

(65) Prior Publication Data

US 2014/0374898 A1 Dec. 25, 2014

Related U.S. Application Data

(63) Continuation of application No. PCT/JP2013/068382, filed on Jul. 4, 2013.

(30) Foreign Application Priority Data

Jul. 18, 2012 (JP) ................... 2012-159795

(51) Int. Cl.
| | |
|---|---|
| *H01L 23/40* | (2006.01) |
| *H01L 23/31* | (2006.01) |
| *H01L 21/56* | (2006.01) |
| *H01L 23/24* | (2006.01) |

(52) U.S. Cl.
CPC .......... *H01L 23/4006* (2013.01); *H01L 21/565* (2013.01); *H01L 23/3107* (2013.01); *H01L 23/4093* (2013.01); *H01L 23/24* (2013.01); *H01L 2023/405* (2013.01); *H01L 2023/4062* (2013.01); *H01L 2023/4075* (2013.01); *H01L 2023/4087* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 4,110,549 A | 8/1978 | Goetzke et al. | |
| 5,483,103 A * | 1/1996 | Blickhan | ............ H01L 23/4006 257/718 |
| 6,979,204 B2 | 12/2005 | Gobl et al. | |
| 2003/0151128 A1 | 8/2003 | Kawaguchi | |
| 2004/0051172 A1* | 3/2004 | Miyazaki | ................ H01L 23/13 257/706 |
| 2009/0261472 A1 | 10/2009 | Bayerer | |
| 2010/0284155 A1 | 11/2010 | Stolze et al. | |
| 2010/0302741 A1* | 12/2010 | Kanschat | ................ H01L 23/24 361/717 |

FOREIGN PATENT DOCUMENTS

| | | |
|---|---|---|
| DE | 10340297 A | 3/2005 |
| JP | 2003243607 A | 8/2003 |

(Continued)

OTHER PUBLICATIONS

International Search Report issued in PCT/JP2013/068382, dated Sep. 24, 2013. English translation provided.

(Continued)

*Primary Examiner* — William Coleman
*Assistant Examiner* — Kien Ly
(74) *Attorney, Agent, or Firm* — Rossi, Kimms & McDowell LLP

(57) ABSTRACT

A semiconductor device includes a terminal case, a beam portion which has elasticity and is connected to the terminal case, divided insulating substrates with a conductive pattern, a fastener which is disposed at the center of the terminal case, and an elastic sealing resin which fills the terminal case.

16 Claims, 19 Drawing Sheets

(56) References Cited

FOREIGN PATENT DOCUMENTS

| | | | |
|---|---|---|---|
| JP | 2003303933 A | 10/2003 | |
| JP | 2004288828 A | 10/2004 | |
| JP | 2011243839 A | 12/2011 | |
| WO | 2014013883 A1 | 1/2014 | |

OTHER PUBLICATIONS

"Easy B-Series Modules Mounting Instructions for EasyPIM (TM) and EasyPack Modules" (AN2006-08) Application Note, V2.0, Jul. 2008.

Extended European Search Report issued in EP13820684.2, mailed Sep. 15, 2015.

\* cited by examiner

SEMICONDUCTOR DEVICE AND SEMICONDUCTOR DEVICE FABRICATION METHOD

CROSS-REFERENCE TO RELATED APPLICATIONS

This application is a continuation of International Application No. PCT/JP2013/068382, filed on Jul. 4, 2013, and is based on and claims priority to Japanese Patent Application No. JP 2012-159795, filed on Jul. 18, 2012. The disclosure of the Japanese priority application and the PCT application in their entirety, including the drawings, claims, and the specification thereof, are incorporated herein by reference.

BACKGROUND

1. Field of the Invention

Embodiments of the present invention relate to a semiconductor device which is simply attached to a cooler and is manufactured at a low cost, and more particularly, to a semiconductor device without a cooling base (for example, a copper base) which comes into contact with a cooler and a semiconductor device manufacturing method.

2. Discussion of the Background

In a general semiconductor device, an insulating substrate with a conductive pattern on which a semiconductor chip is mounted is fixed to a cooling base (for example, a copper base) and the cooling base is fixed to a cooler (cooling fin).

In recent years, a method has been used which directly fixes an insulating substrate with a conductive pattern to a cooler (for example, a cooling fin), without passing through a cooling base, in order to reduce manufacturing costs and thermal resistance in a low-power semiconductor device.

This semiconductor device is called a copper-base-less type and the insulating substrate with a conductive pattern is a direct copper bonding (DCB) substrate or an aluminum insulating substrate. In addition, for example, a terminal case in which a terminal is attached to a resin case or a case formed by a transfer mold is used as a package and gel (silicon gel) or epoxy resin is used as a sealing resin.

Three representative examples of a method for attaching the copper-base-less semiconductor device to the cooler according to the related art will be described below.

First, there is a method which screws clamps 52 (two positions) which protrude to the outside of a case 51 of a semiconductor device 500 as shown in FIG. 18 of Infineon, "AN2006-08", Application Note, V2.0, July 2008 ("Non-patent Document 1").

Second, there is a method in which holes 55 through which screws pass are formed at both ends (two positions) of a case 54 of a semiconductor device 600 and the semiconductor device 600 is screwed, as shown in FIG. 19 of JP 11-243839 A ("Patent Document 1").

Third, there is a method in which a hole 58 through which a screw passes is formed at the center of a case 57 of a semiconductor device 700 and the semiconductor device 700 is screwed, as shown in FIG. 20 of U.S. Pat. No. 6,979,204 (Patent Document 2).

In the drawings, reference numerals 53, 56, and 59 indicate an insulating substrate with a conductive pattern.

However, in the semiconductor devices 500 to 700 disclosed in Non-patent Document 1, Patent Document 1, and Patent Document 2, as described above, since the semiconductor device is attached to the cooler only by screws, it is necessary to manage screw tightening torque.

In the semiconductor devices 500 and 600 disclosed in Non-patent Document 1 and Patent Document 1, since the area of the screw portion for attachment to the cooler is a dead space, the external dimensions of the semiconductor devices 500 and 600 increase.

In the semiconductor device 500 disclosed in Non-patent Document 1, when the warping of the surface of a back side conductor 53a of an insulating substrate 53 with a conductive pattern which is not divided is examined, as shown in FIG. 21, the surface warps toward the front side of the insulating substrate 53 with a conductive pattern and the warping is not necessarily concentrically spread from the center of the semiconductor device. A significant amount of warping may occur in a portion 60 that is separated from the center of the back side conductor 53a.

In FIG. 21, reference numeral 61 indicates a contour line and the portion 60 is lower than other portions. As such, when the portion 60 in which a significant amount of warping occurs is separated from the center of the back side conductor 53a, the adhesion between the back side conductor 53a and the cooler is reduced during the attachment of the semiconductor device 500 to the cooler and the contact thermal resistance between the semiconductor device 500 and the cooler increases. In addition, in some cases, a thermal grease is applied onto a contact surface between the semiconductor device 500 and the cooler in order to prevent an increase in the contact thermal resistance. However, in the portion in which a large amount of warping occurs, the amount of thermal grease applied increases and thermal resistance increases.

The semiconductor devices 500 to 700 disclosed in the above-mentioned three patent documents will be described in detail below.

In the semiconductor devices 500, 600, and 700, in an assembly process, a screwing operation is required and torque management for screwing is also required. In addition, it takes a lot of time to perform the screwing operation.

That is, in the semiconductor devices 500, 600, and 700, the semiconductor device is attached to the cooler only by screws and a screwing operation is required. In the assembly process, torque management for screwing is required. As a result, manufacturing costs increase.

In the semiconductor devices 500 and 600, screwing portions are disposed in the outer circumference of the cases 51 and 54. The portions are dead spaces. Therefore, the external dimensions increase.

Since one insulating substrate 53, 56, or 59 with a conductive pattern is directly attached to the cooler, the shape of warping (curve) is not fixed, but varies for each semiconductor device. In particular, in the semiconductor device 500, a significant amount of warping occurs in the insulating substrate 53 with a conductive pattern.

As described above, since the shape of the warping of the insulating substrates 53 and 56 with a conductive pattern is not fixed, it is difficult to manage warping. Therefore, when the insulating substrates 53 or 56 are fixed to the cooler by screws, the adhesion between the semiconductor device 500 or 600 and the cooler is reduced depending on the position of the portion in which a significant amount of warping occurs.

SUMMARY

Embodiments of the invention provide a semiconductor device which is closely attached to a cooler with a simple structure, without torque management, and can reduce contact thermal resistance, external dimensions, and manufacturing costs and a semiconductor device manufacturing method.

According to a first aspect of the invention, a semiconductor device includes: a plurality of insulating substrates with a conductive pattern, each of which includes a conductor formed on a main surface of an insulating plate; a case which accommodates the plurality of insulating substrates with a conductive pattern such that one main surface of each of the insulating substrates with a conductive pattern is exposed and to which a cooler that comes into contact with the exposed main surface of each of the plurality of insulating substrates with a conductive pattern is attached; a beam portion that is provided in the case in a beam shape so as to face the other main surfaces of the plurality of insulating substrates with a conductive pattern accommodated in the case; and a fastener that has a post shape, is provided at the center of the beam portion, and has a leading end which is inserted into an attachment hole of the cooler attached to the case such that the beam portion is distorted.

According to a second aspect of the invention, the semiconductor device according to the first aspect may further include a sealing resin that fills the case so as to come into contact with the plurality of insulating substrates with a conductive pattern and the beam portion.

According to a third aspect of the invention, in the semiconductor device according to the second aspect, the sealing resin may be made of an elastic material.

According to a fourth aspect of the invention, in the semiconductor device according to the first aspect, the plurality of insulating substrates with a conductive pattern may be accommodated in the case so as to surround the fastener having the leading end attached to the cooler.

According to a fifth aspect of the invention, in the semiconductor device according to the third aspect, the plurality of insulating substrates with a conductive pattern may be raised toward the beam portion such that a portion thereof close to the fastener is higher than an outer circumferential portion close to the case.

According to a sixth aspect of the invention, in the semiconductor device according to the first or second aspect, the case, the beam portion, and the fastener may be integrally formed of a resin by molding.

According to a seventh aspect of the invention, in the semiconductor device according to the first aspect, the fastener may include a post and a hook portion which is provided at a leading end of the post and a cutout may be formed in the post so as to extend from the bottom of the hook portion.

According to an eighth aspect of the invention, in the semiconductor device according to the first aspect, the plurality of insulating substrates with a conductive pattern may be formed by radially dividing a large insulating substrate with a conductive pattern.

According to a ninth aspect of the invention, in the semiconductor device according to the first aspect, a screw may be formed at the leading end of the fastener.

According to a tenth aspect of the invention, a semiconductor device manufacturing method includes: a step of placing a plurality of insulating substrates with a conductive pattern, each of which includes a conductor formed on a main surface of an insulating plate, on a jig such that the plurality of insulating substrates with a conductive pattern surround a central hole of the jig and one main surface of each of the plurality of insulating substrates with a conductive pattern faces the jig; and a step of covering the plurality of insulating substrates with a conductive pattern with a terminal case, in which a case which accommodates the plurality of insulating substrates with a conductive pattern such that the one main surface of each of the insulating substrates with a conductive pattern is exposed and to which a cooler that comes into contact with the exposed main surface of each of the plurality of insulating substrates with a conductive pattern is attached, a beam portion that is provided in the case in a beam shape so as to face the other main surfaces of the plurality of insulating substrates with a conductive pattern accommodated in the case, and a fastener that has a post shape, is provided at the center of the beam portion, and has a leading end which is inserted into an attachment hole of the cooler attached to the case such that the beam portion is distorted are integrally molded, such that the leading end of the fastener is aligned with the central hole of the jig.

According to an eleventh aspect of the invention, the semiconductor device manufacturing method according to the tenth aspect may further include a step of filling the terminal case which covers the plurality of insulating substrate with a conductive pattern with a sealing resin and solidifying the sealing resin which comes into contact with the plurality of insulating substrate with a conductive pattern and the beam portion.

According to a twelfth aspect of the invention, the semiconductor device manufacturing method according to the eleventh aspect may further include a step of pressing the center of the beam portion against the jig to insert the leading end of the fastener into an insertion hole of the jig, thereby distorting the beam portion, before the terminal case is filled with the sealing resin.

According to a thirteenth aspect of the invention, the semiconductor device manufacturing method according to the twelfth aspect may further include a step of dividing the jig into two parts along a cutting line which passes through the insertion hole provided at the center of the jig and returning the distorted beam portion to the original position, after the beam portion is distorted and the sealing resin is solidified.

According to embodiments of the invention, the semiconductor device includes the insulating substrates with a conductive pattern, the case which accommodates the insulating substrates with a conductive pattern such that one main surface of each of the insulating substrates with a conductive pattern is exposed and is attached to the cooler, and the beam portion that is provided in the case in the beam shape so as to face the other main surfaces of the insulating substrates with a conductive pattern. The leading end of the fastener that has a post shape and is provided at the center of the beam portion is inserted into the attachment hole of the cooler attached to the case such that the beam portion is distorted. Therefore, it is possible to increase adhesion to the cooler and to reduce contact thermal resistance.

The sealing resin fills the case so as to come into contact with the plurality of insulating substrates with a conductive pattern and the beam portion. Therefore, the semiconductor device can be closely attached to the cooler.

The plurality of insulating substrates with a conductive pattern surround the fastener having the leading end attached to the cooler and are raised toward the beam portion such that the a portion thereof close to the fastener is higher than an outer circumferential portion close to the case. Therefore, the semiconductor device can be simply attached to the cooler by a one-touch operation. The attachment does not require torque management which is required for screwing and it is possible to provide an inexpensive semiconductor device.

Since the attachment portion is disposed at the center of the case, it is possible to reduce the external dimensions, as compared to the related art in which the attachment portion is disposed in the outer circumferential portion. Therefore, it is possible to provide a small semiconductor device.

The above and other objects, features, and advantages of the invention will become apparent from the following detailed description taken with the accompanying drawings indicating the preferred embodiments of the invention.

BRIEF DESCRIPTION OF DRAWINGS

FIG. 14A is a plan view and FIG. 14B is a cross-sectional view.

FIG. 18A is a side view and FIG. 18B is a top view.

FIG. 19A is a side view and FIG. 19B is a top view.

FIG. 20A is a side view and FIG. 20B is a top view.

DESCRIPTION OF ILLUSTRATED EMBODIMENTS

Figure 1A:
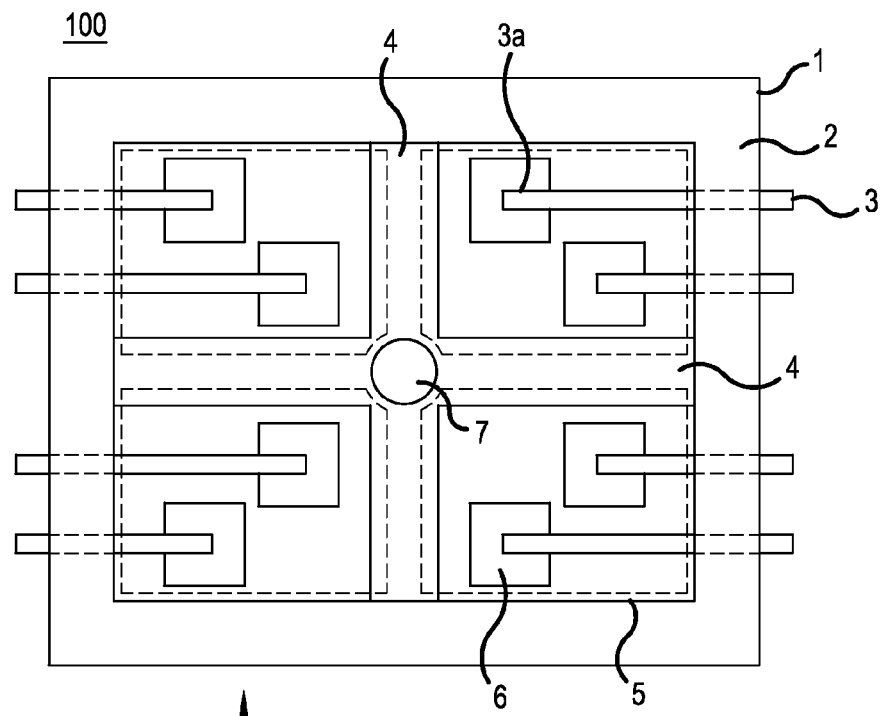
FIG. 1A is a plan view of a main portion of the structure of a semiconductor device according to a first embodiment.
Figure 1B:
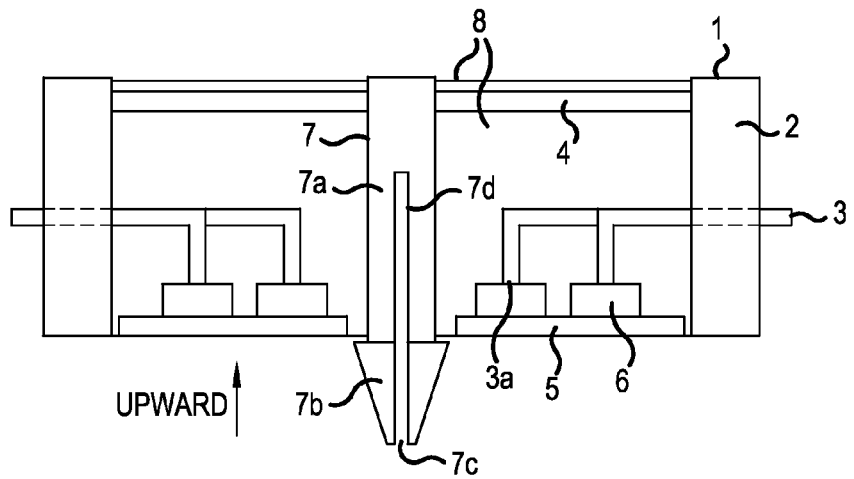
FIG. 1B is a side cross-sectional view as viewed from an arrow A of FIG. 1A.
Figure 1C:
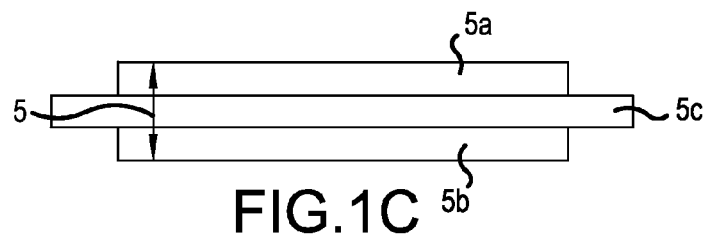
FIG. 1C is a cross-sectional view illustrating a main portion of an insulating substrate with a conductive pattern.

FIG. 1A is a plan view of a main portion of the structure of a semiconductor device according to a first embodiment, FIG. 1B is a side cross-sectional view as viewed from an arrow A of FIG. 1A, and FIG. 1C is a cross-sectional view illustrating a main portion of an insulating substrate with a conductive pattern.

A semiconductor device 100 includes a terminal case 1 in which terminals 3, which are external lead terminals, are fixed to an outer frame 2, which is a case, and a cross-shaped beam portion 4 that is connected to the terminal case 1 and has elasticity (spring action). The semiconductor device 100 includes four divided insulating substrates 5 with a conductive pattern and semiconductor chips 6 that are fixed to each insulating substrate 5 with a conductive pattern. The insulating substrate 5 with a conductive pattern has a size of, for example, 20 mm×30 mm. In addition, the semiconductor device 100 includes a fastener 7 that is fixed to the center of the beam portion 4 and protrudes to the lower side of the insulating substrate 5 with a conductive pattern and a sealing resin 8 that fills the terminal case 1 and has elasticity. The terminal case 1, the beam portion 4, and the fastener 7 are formed of the same resin material (for example, PBT: polybutylene terephthalate) by molding. Each of the terminal case 1, the beam portion 4, and the fastener 7 may be fixed by an adhesive. Since the beam portion 4 has a spring action, it has a small thickness of, for example, about 1 mm. In addition, the beam portion 4 has a width of a few millimeters, for example, 4 mm. The terminal 3 is a connection conductor plate with a small width.

The leading end 3a of the terminal 3 (external lead terminal) in the terminal case 1 is fixed to the semiconductor chip 6 or the insulating substrate 5 with a conductive pattern by solder (not shown). The semiconductor chip 6 is fixed to a conductive pattern 5a (FIG. 1C) of the insulating substrate 5 with a conductive pattern by solder (not shown). A material with high adhesion between the terminal case 1 and the insulating substrate 5 with a conductive pattern is used as the sealing resin 8 that has elasticity and fills the terminal case 1. For example, a bonding material with high adhesion may be used. Specifically, for example, RTV Rubber manufactured by Shin-Etsu Chemical Co., Ltd. May be used. The insulating substrate 5 with a conductive pattern and the inner wall of the terminal case 1 do not come into close contact with each other, but may come into loose contact with each other or may have a gap therebetween. The contact makes it possible for the insulating substrate 5 with a conductive pattern to be moved by the viscosity of the sealing resin 8 when the semiconductor device 100 is attached to a cooler 11, which will be described below. The relationship between the insulating substrate 5 with a conductive pattern and the inner wall of the terminal case 1 and the relationship between the insulating substrate 5 with a conductive pattern and the sealing resin 8 hold for Embodiments 2 to 6, which will be described below.

A back side conductor 5b (FIG. 1C) of each insulating substrate 5 with a conductive pattern is little curved and is flat. In Embodiment 1, four divided insulating substrates 5 with a conductive pattern are provided. However, two divided insulating substrates 5 with a conductive pattern may be provided. That is, the insulating substrate 5 with a conductive pattern may be divided into a plurality of insulating substrates along lines which radially extend from the center of the terminal case 1. As shown in FIG. 1C, the insulating substrate 5 with a conductive pattern includes an insulating substrate 5c, such as a ceramic plate, the conductive pattern 5a which is a conductor formed on the front surface of the insulating substrate 5c, and a back side conductor 5b which is formed on the back side. As described above, the semiconductor chip 6 is soldered to the conductive pattern 5a and the back side conductor 5b comes into pressure contact with a cooler (not shown).

The fastener 7 includes a post 7a and a hook portion 7b that is provided at the lower end of the post 7a. A cutout 7d is formed in the post 7a so as to extend from the bottom 7c of the hook portion 7b in the longitudinal direction (downward direction). The cutout 7d is used to fix the semiconductor device 100 to the cooler (not shown) through the fastener 7. The hook portion 7b is formed such that the cross-sectional area thereof increases toward the upper side. In FIG. 1, the cutout 7d is formed in one direction from the front side to the rear side of the plane of paper. However, the cutout 7d may also be formed along the central axis of the post 7a in a direction perpendicular to the cutout 7d. In addition, a plurality of cutouts may be formed along the central axis of the post 7a so as to intersect each other. The structure of the cutout holds for Embodiments 2 to 4 and Embodiment 6.

Figure 2:
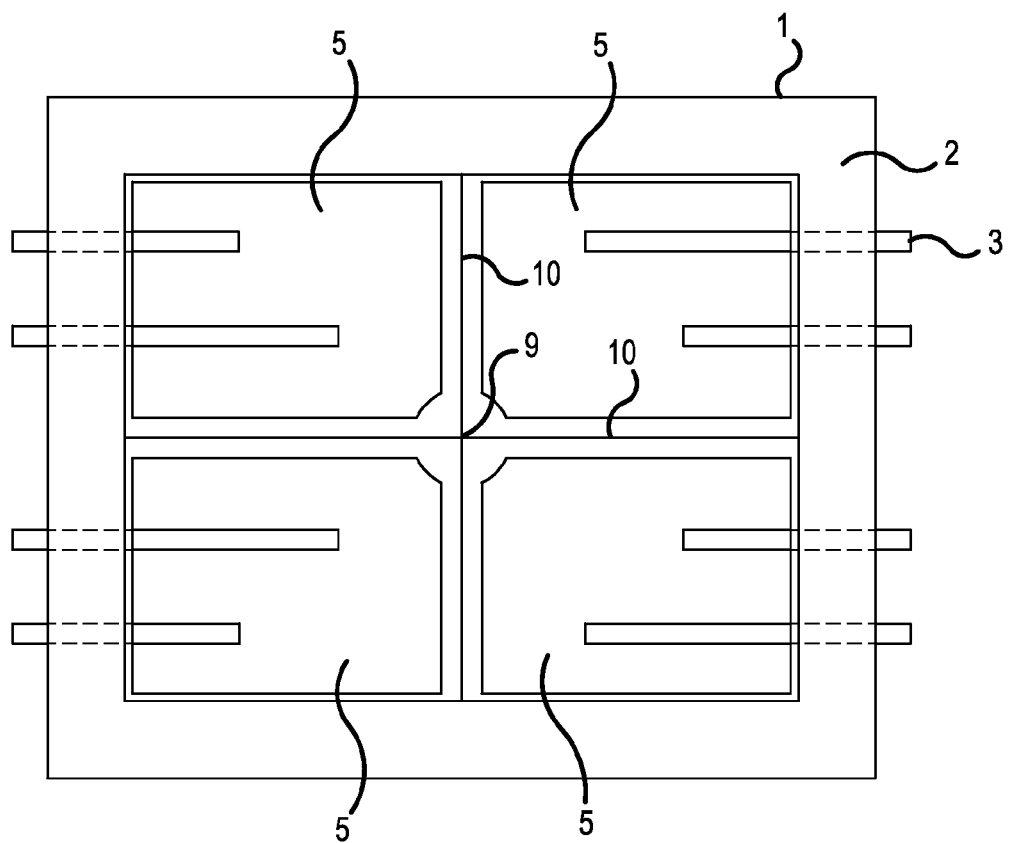
FIG. 2 is a plan view illustrating the main portion of the insulating substrate with a conductive pattern in a terminal case shown in FIG. 1.

FIG. 2 is a plan view illustrating the arrangement of the insulating substrates with a conductive pattern in the terminal case shown in FIG. 1. In FIG. 2, the beam portion 4 and the fastener 7 are not shown. Four divided insulating substrates 5 with a conductive pattern are arranged around the center 9 where the fastener 7 is provided. A dividing line 10 by which the insulating substrate with a conductive pattern is divided into four insulating substrates 5 with a conductive pattern extends radially (here, in a cross shape) from the position of the fastener 7. That is, the divided insulating substrates 5 with a conductive pattern are radially arranged from the fastener 7.

Figure 3A:
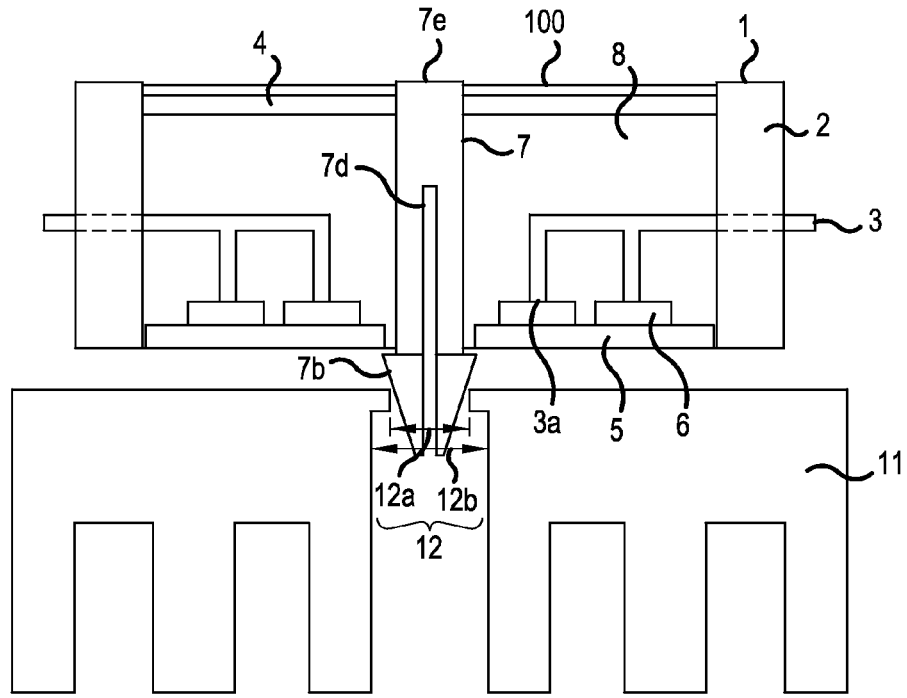
FIGS. 3A and 3B are diagrams sequentially illustrating processes of attaching the semiconductor device to a cooler.

FIGS. 3A to 4B are diagrams sequentially illustrating a process of attaching the semiconductor device to the cooler. In FIG. 3A, the semiconductor device 100 is arranged on a cooler 11. In this case, the center of the hook portion 7b of the semiconductor device 100 is aligned with an attachment hole 12 provided at the center of the cooler 11. The attachment hole 12 has a two-stage structure in which the upper stage is a hole 12a and the lower stage is a hole 12b with a larger diameter than the hole 12a. The diameter of the hole 12a is equal to or greater than a value obtained by subtracting the width dd of the cutout 7d from the maximum diameter AA of the hook portion 7b and is less than the maximum diameter AA of the hook portion 7b. The diameter of the hole 12b is equal to or greater than the maximum diameter AA of the hook portion 7b. The structure of the holes 12a and 12b holds for Embodiments 2 to 4 and Embodiment 6.

Figure 3B:
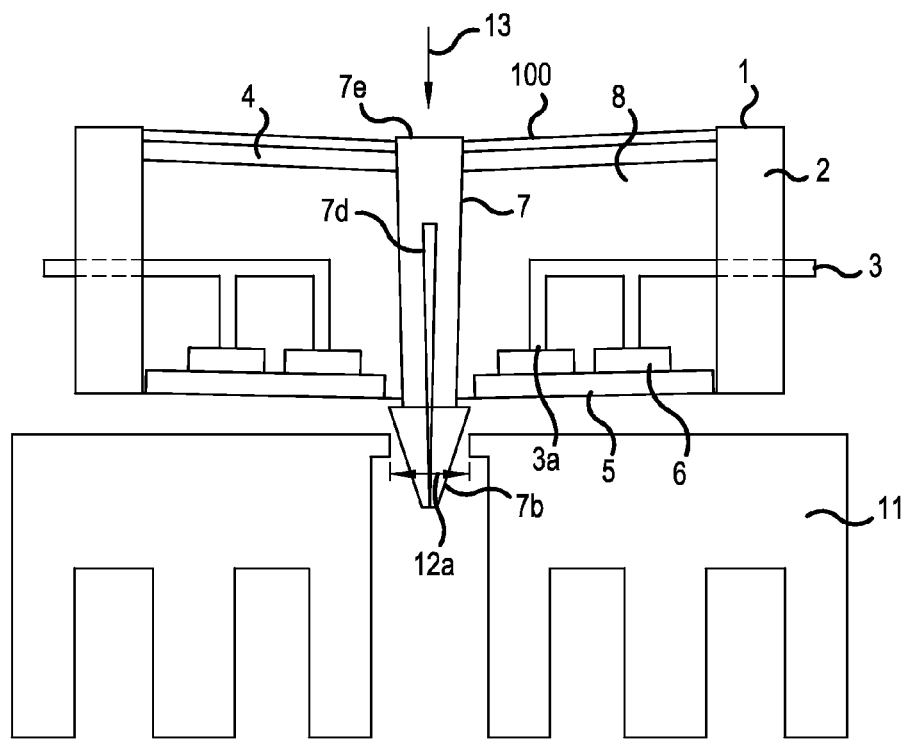

In FIG. 3B, force 13 is applied to a vertex 7e of the post 7a of the fastener 7 to press the hook portion 7b provided at the leading end of the fastener 7 to the hole 12a of the cooler 11. In this case, the cutout 7d formed in the post 7a is narrowed and the diameter of the hook portion 7b is reduced. The hook portion 7b can pass through the hole 12a of the cooler 11. In this case, the beam portion 4 is distorted downward and the sealing resin 8 interposed between the beam portion 4, which is an elastic body, and the insulating substrate 5 with a conductive pattern is compressed.

Figure 4A:
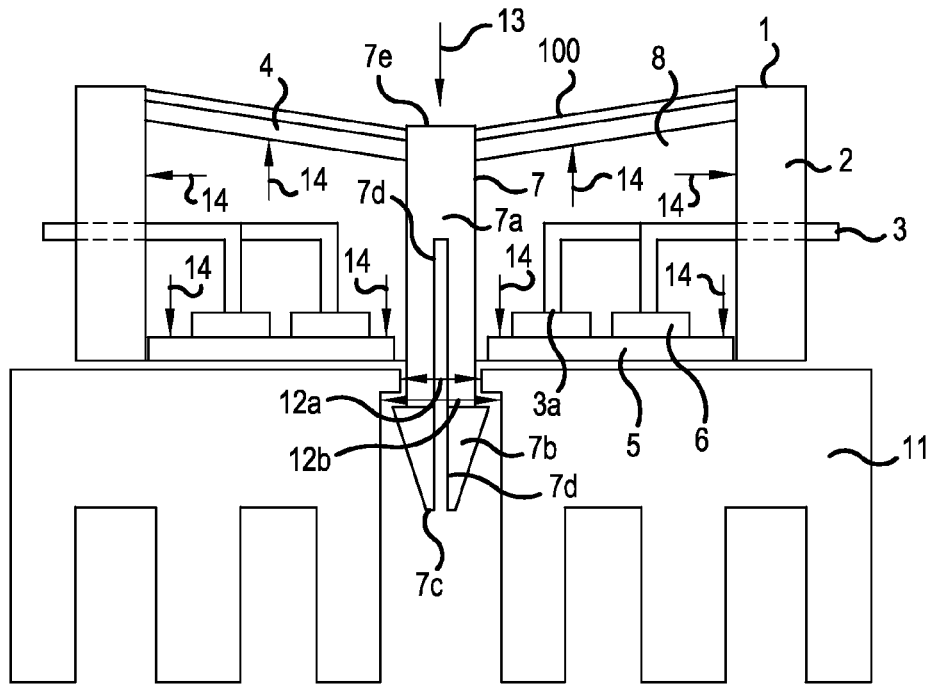
FIGS. 4A and 4B are diagrams sequentially illustrating the processes of attaching the semiconductor device to the cooler, which follow FIG. 3B.

In FIG. 4A, after the hook portion 7b passes through the hole 12a of the cooler 11, the cutout 7d is spread by a spring action and returns to the original size. The sealing resin 8 is compressed by the force 13 and repulsive force 14 is applied in all directions like hydrostatic pressure.

Figure 4B:
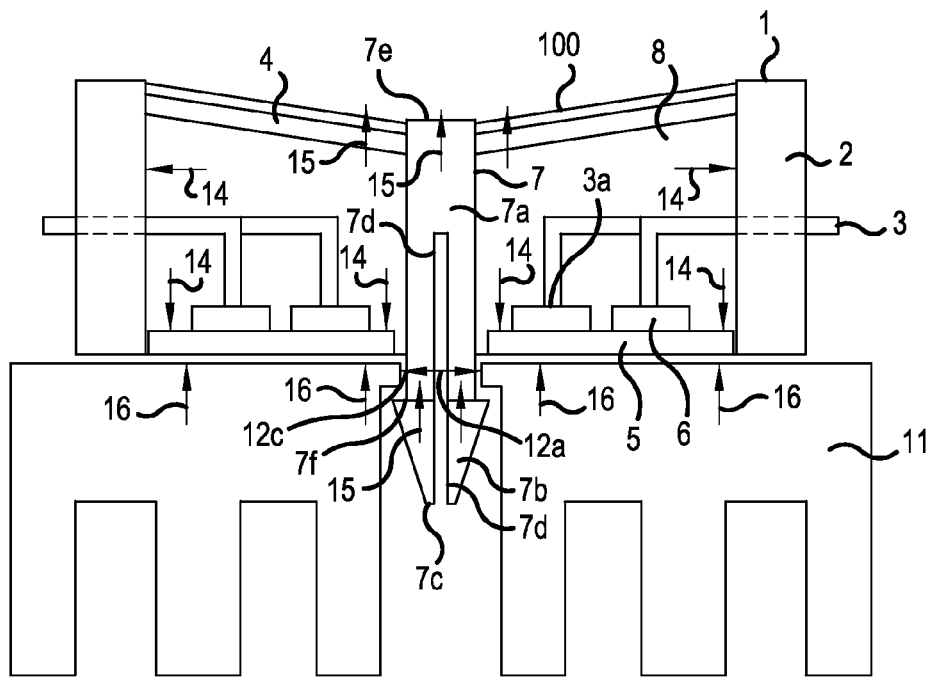

In FIG. 4B, when the force 13 applied to the vertex 7e of the fastener 7 is removed, the beam portion 4 which is distorted downward is raised by the spring action and force to return the beam portion 4 and the compressed sealing resin 8 to the original state acts as the repulsive force 14 and repulsive force 15. In this case, since the compressed sealing resin 8 does not return to the original state, the repulsive force 14 applied to the sealing resin 8 is maintained. The repulsive force 14 presses the insulating substrates 5 with a conductive pattern to the lower side. When the beam portion 4 is drawn to the upper side by the repulsive force 15, an upper end portion 7f of the hook portion 7b provided at the leading end of the fastener 7 presses the bottom 12c of the hole 12a of the cooler 11. The repulsive force 15 of the beam portion 4 is transmitted to the cooler 11 through the fastener 7 and the cooler 11 is pressed upward. The insulating substrates 5 with a conductive pattern are pressed by force 16. The insulating substrates 5 with a conductive pattern come into close contact with the cooler 11 and are fixed thereto by the repulsive force 14 of the sealing resin 8 and the force 16 to raise the cooler 11. As such, since the hook portion 7b is formed at the leading end of the fastener 7, the hook portion 7b is inserted into the hole 12 of the cooler 11 only by a one-touch operation of applying the force 13 to the vertex 7e of the fastener 7. It is possible to bring the semiconductor device 100 into close contact with the cooler 11 and to fix the semiconductor device 100 to the cooler 11 with a simple structure.

Since the insulating substrate 5 with a conductive pattern forming the semiconductor device 100 is divided, it is possible to increase adhesion to the cooler 11 and to reduce contact thermal resistance. In addition, in the semiconductor device 100, since the fastener 7 is arranged at the center of the terminal case 1 in a plan view, it is possible to reduce the external dimensions of the semiconductor device, as compared to the semiconductor device disclosed in Non-patent Document 1 or Patent Document 1. In addition, in the semiconductor device 100, since the hook portion 7b is provided in the fastener 7, it is possible to bring the semiconductor device 100 into close contact with the cooler 11 and to fix the semiconductor device 100 to the cooler 11 with a simple structure. Therefore, a screwing operation requiring a lot of time is not required and torque management is not required. As a result, it is possible to reduce manufacturing costs.

Embodiment 2

FIGS. 5A to 6B are cross-sectional views sequentially illustrating main manufacturing processes of a semiconductor device manufacturing method according to a second embodiment.

Figure 5A:
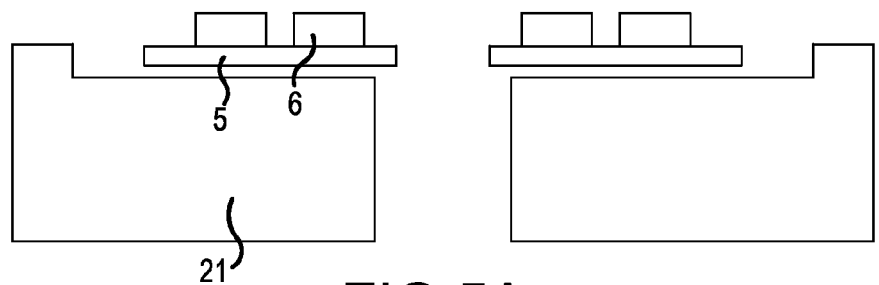
FIGS. 5A, 5B, and 5C are cross-sectional views sequentially illustrating main manufacturing processes of a semiconductor device manufacturing method according to a second embodiment.

In FIG. 5A, insulating substrates 5 with a conductive pattern are placed on a solder jig 21. Solder (not shown) is applied onto the insulating substrates 5 (conductive patterns 5a) with a conductive pattern. Semiconductor chips 6 are placed on the applied solder.

Figure 5B:
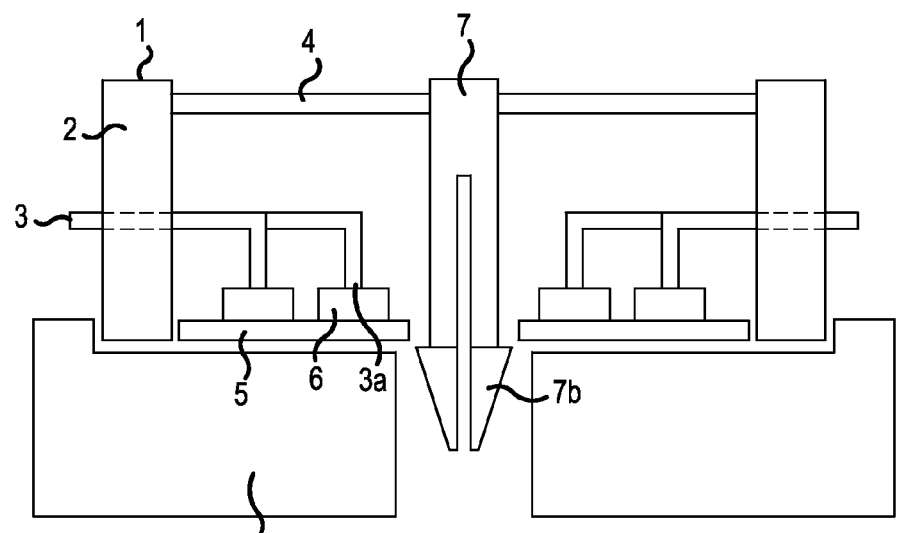

In FIG. 5B, solder (not shown) is applied onto the semiconductor chips 6. A terminal case 1 in which a beam portion 4 and a fastener 7 are integrally molded is provided on the semiconductor chips 6 such that a leading end 3a of a terminal 3 (external lead terminal) is provided on the semiconductor chip 6. Then, the temperature of the solder jig 21 is increased to melt the solder. Then, the solder jig 21 is cooled to solidify the solder such that the insulating substrates 5 with a conductive pattern are soldered to the semiconductor chips 6 and the semiconductor chips 6 are soldered to the terminals 3 (leading ends 3a).

Figure 5C:
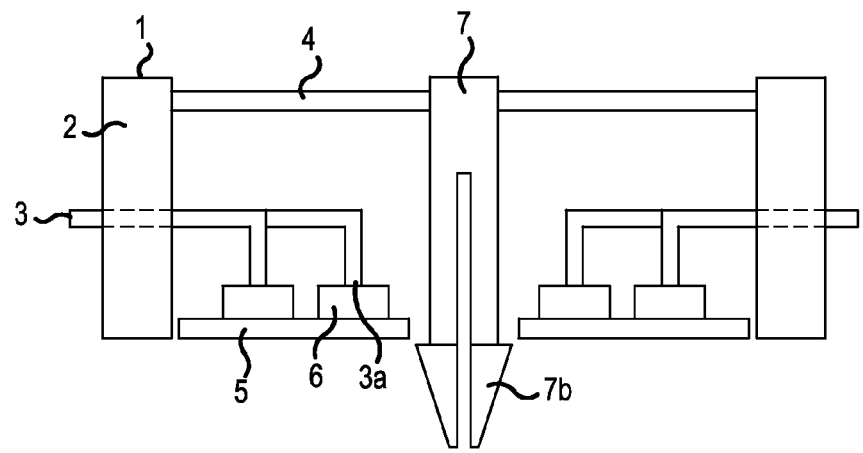

In FIG. 5C, the terminal case 1 in which the terminals 3 (leading ends 3a) are soldered to the semiconductor chips 6 and the semiconductor chips 6 are soldered to the insulating substrates 5 with a conductive pattern is taken off from the solder jig 21.

Figure 6A:
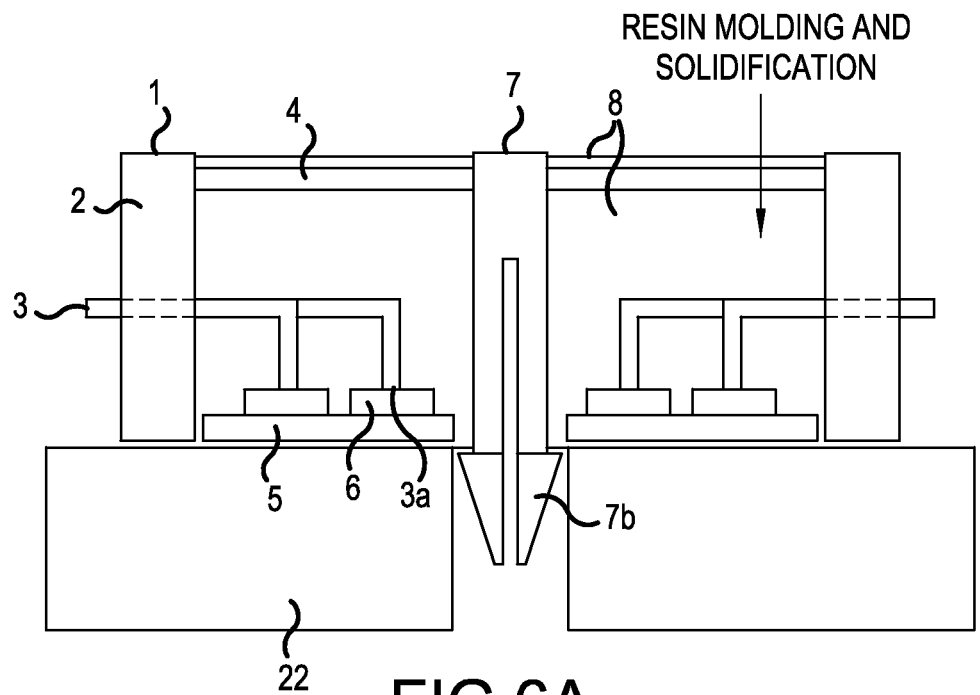
FIGS. 6A and 6B are diagrams sequentially illustrating the main manufacturing processes of the semiconductor device manufacturing method according to the second embodiment, which follow FIG. 5C.

In FIG. 6A, the terminal case 1 after soldering is placed on a resin molding jig 22 and the sealing resin 8 is molded and solidified. The sealing resin 8 is the existing resin with elasticity and is, for example, a bonding material with high adhesion.

Figure 6B:
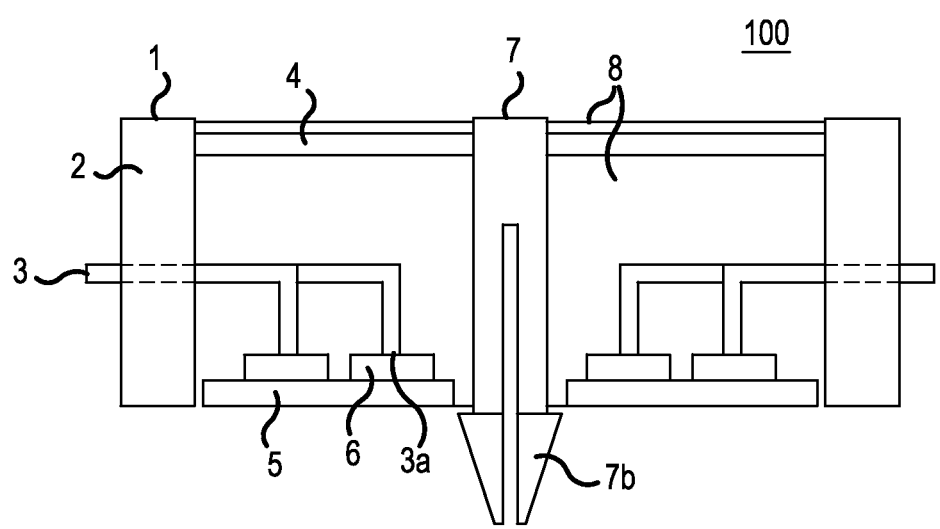

In FIG. 6B, the terminal case 1 in which the sealing resin 8 is molded and solidified is taken off from the resin molding jig 22. In the semiconductor device 100, the entire exposed surface of a back side conductor 5b of each of the four divided insulating substrates 5 with a conductive pattern is flat (see FIGS. 1A-C). Therefore, when the semiconductor device 100 is attached to a cooler 11, a contact force tends to increase in the vicinity of the fastener 7 and to decrease in an outer circumferential portion in the contact surface between the semiconductor device 100 and the cooler 11. A method which solves the problem and can fix the semiconductor device from the vicinity of the fastener 7 to the outer circumferential portion will be described below.

Embodiment 3

Figure 7A:
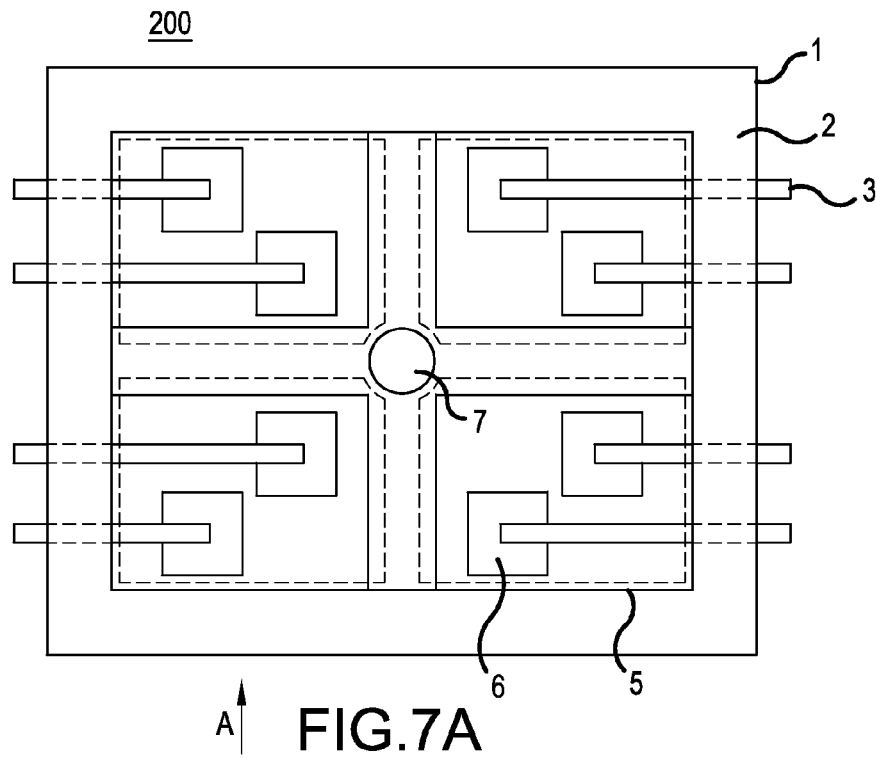
FIG. 7A is a plan view a main portion of the structure of a semiconductor device according to a third embodiment.
Figure 7B:
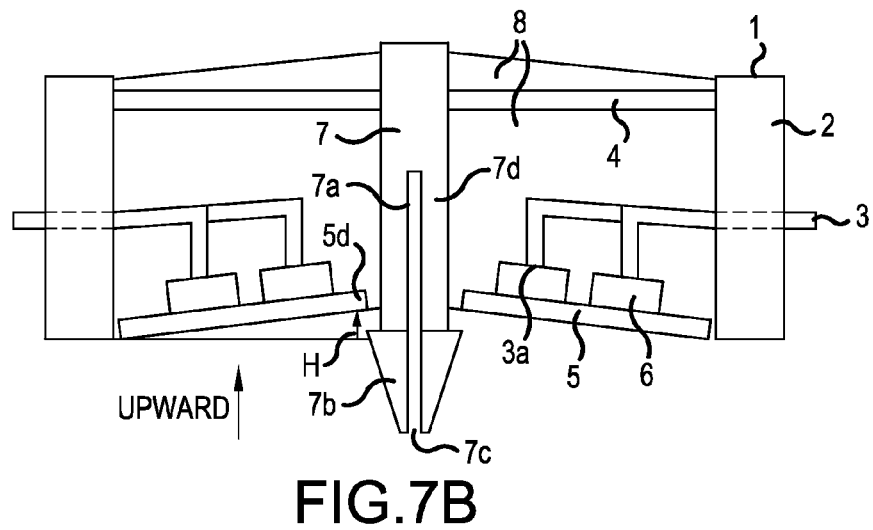
FIG. 7B is a side cross-sectional view as viewed from an arrow A of FIG. 7A.
Figure 7C:
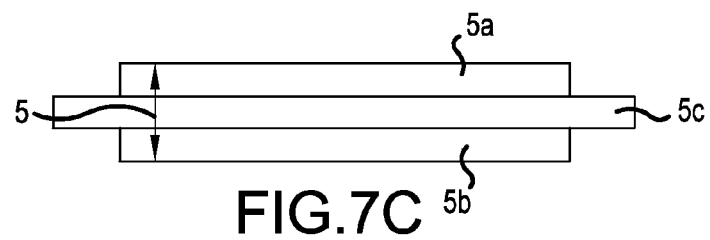
FIG. 7C is a cross-sectional view illustrating a main portion of an insulating substrate with a conductive pattern.

FIG. 7A is a plan view of a main portion of the structure of a semiconductor device according to a third embodiment, FIG. 7B is a side cross-sectional view as viewed from an arrow A of FIG. 7A, and FIG. 7C is a cross-sectional view illustrating a main portion of an insulating substrate with a conductive pattern.

A semiconductor device 200 differs from the semiconductor device 100 (see FIGS. 1A-C) in that a portion of an insulating substrate 5 with a conductive pattern, which is adjacent to a fastener 7, is raised. A raised height H is in the range of about 100 μm to 200 μm and the upper surface of a sealing resin 8 is also raised by the height. Therefore, the upper surface of the semiconductor device 200 is curved upward in a convex shape by a height of about 100 μm to 200 μm.

Figure 8:
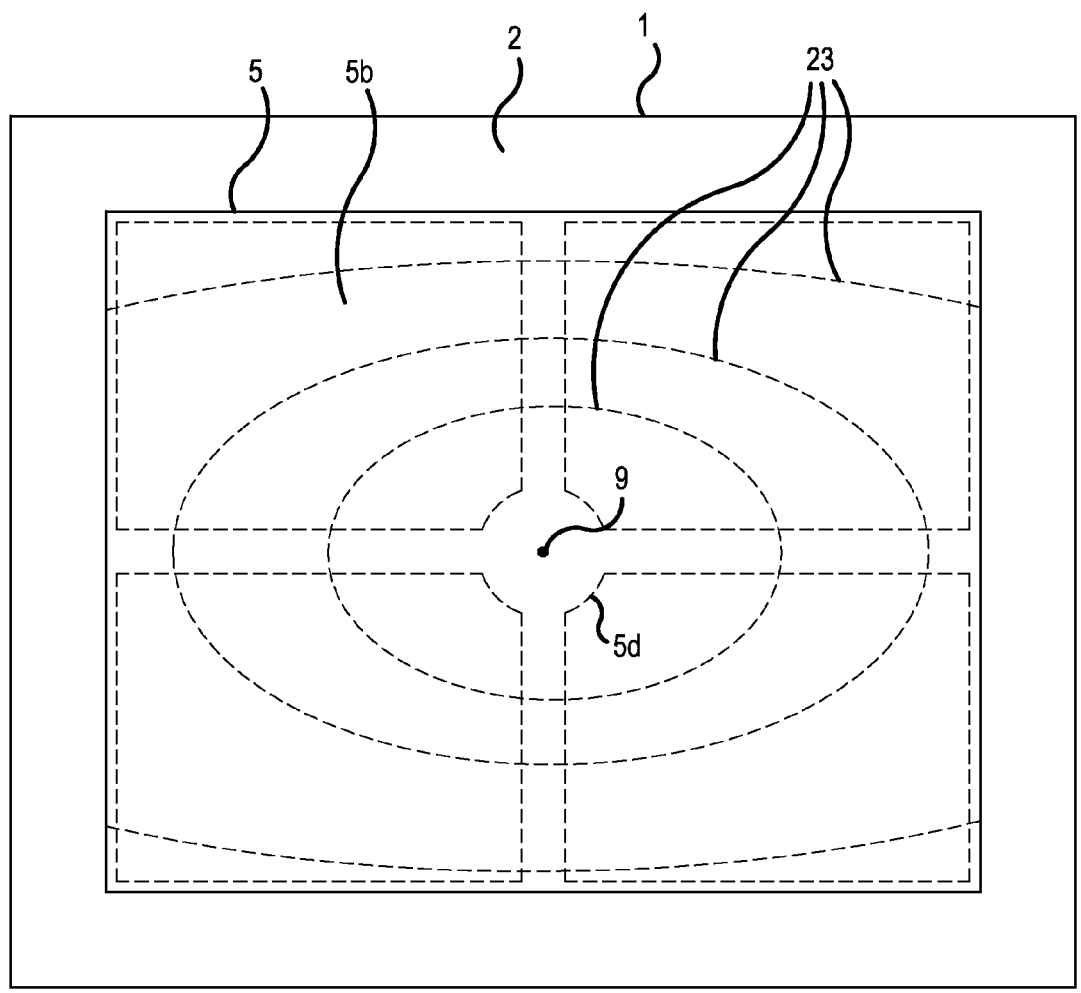
FIG. 8 is a diagram illustrating the warping of a back side conductor of the insulating substrate with a conductive pattern shown in FIG. 7.

FIG. 8 is a diagram illustrating the warping of a back side conductor of the insulating substrate with a conductive pattern shown in FIG. 7. The insulating substrates are curved such that the curve is concave upward. In FIG. 8, among contours line 23 of the curve, a contour line at the center indicates the smallest height (is concave upward) and the height increases concentrically toward the outer circumferential portion. As such, warping uniformly occurs from the center to the outer circumference. Therefore, when the semiconductor device 200 is attached to a cooler 11, it is possible to increase the adhesion (contact force) between the insulating substrates 5 with a conductive pattern and the cooler 11.

FIGS. 9A to 10B are diagrams sequentially illustrating processes of attaching the semiconductor device to the cooler.

Figure 9A:
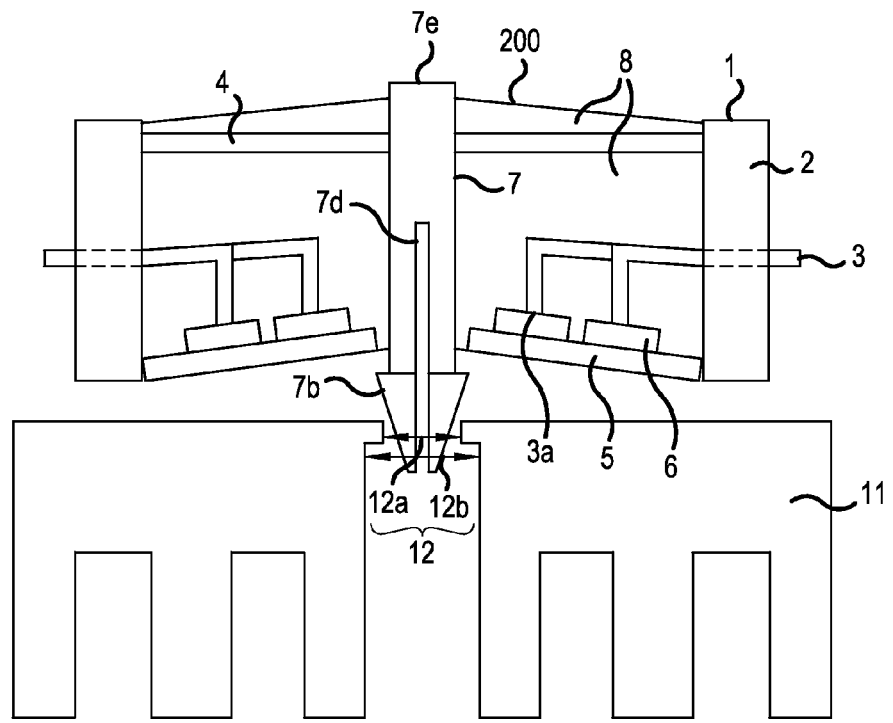
FIGS. 9A and 9B are diagrams sequentially illustrating a process of attaching the semiconductor device to a cooler.

In FIG. 9A, the semiconductor device 200 is arranged on the cooler 11. In this case, the center of a hook portion 7b of the semiconductor device 200 is aligned with an attachment hole 12 provided at the center of the cooler 11. The attachment hole 12 has a two-stage structure in which the upper stage is a hole 12a and the lower stage is a hole 12b with a larger diameter than the hole 12a.

Figure 9B:
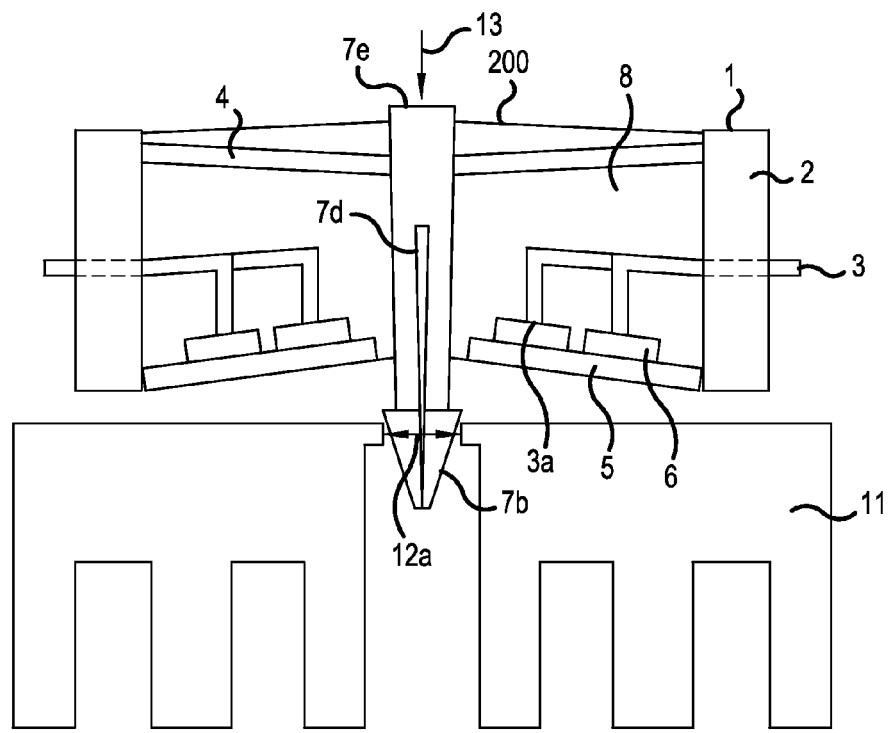

In FIG. 9B, force 13 is applied to a vertex 7e of a post 7a of the fastener 7 to press a hook portion 7b provided at the leading end of the fastener 7 to the hole 12a of the cooler 11. In this case, a cutout 7d formed in the post 7a is narrowed and the diameter of the hook portion 7b is reduced. The hook portion 7b can pass through the hole 12a of the cooler 11. In this case, a beam portion 4 which is provided on the upper side is distorted downward and a back side conductor 5b of the insulating substrate 5 with a conductive pattern comes into contact with the entire region of the cooler 11.

Figure 10A:
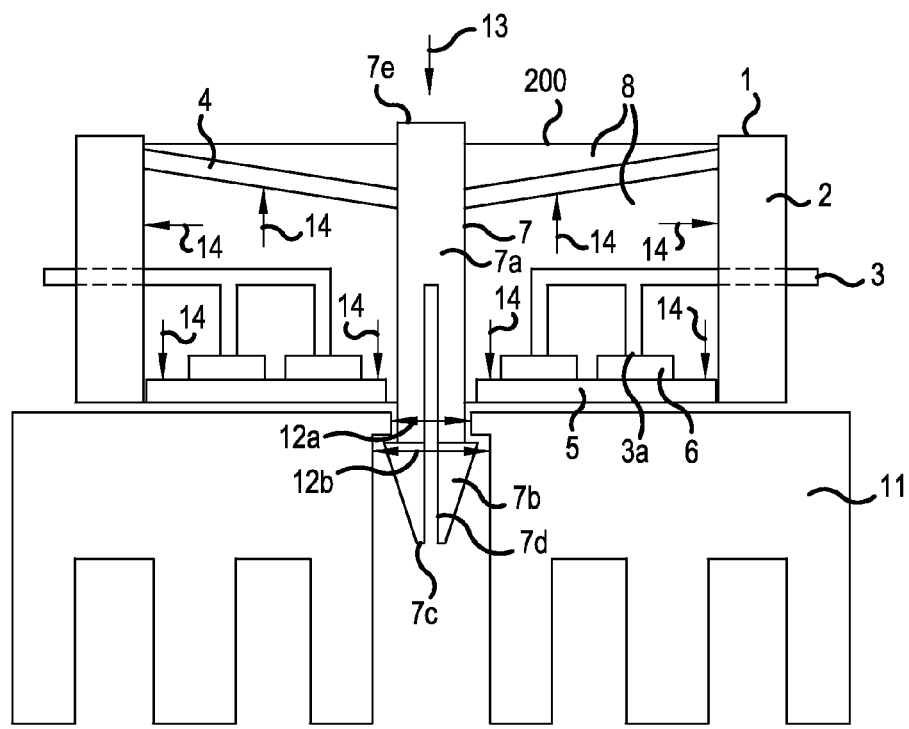
FIGS. 10A and 10B are diagrams illustrating the process of attaching the semiconductor device to the cooler, which follows FIG. 9B.

In FIG. 10A, after the hook portion 7b passes through the hole 12a of the cooler 11, the cutout 7d is spread and returns to the original state. The cutout 7d returns to the original size.

Figure 10B:
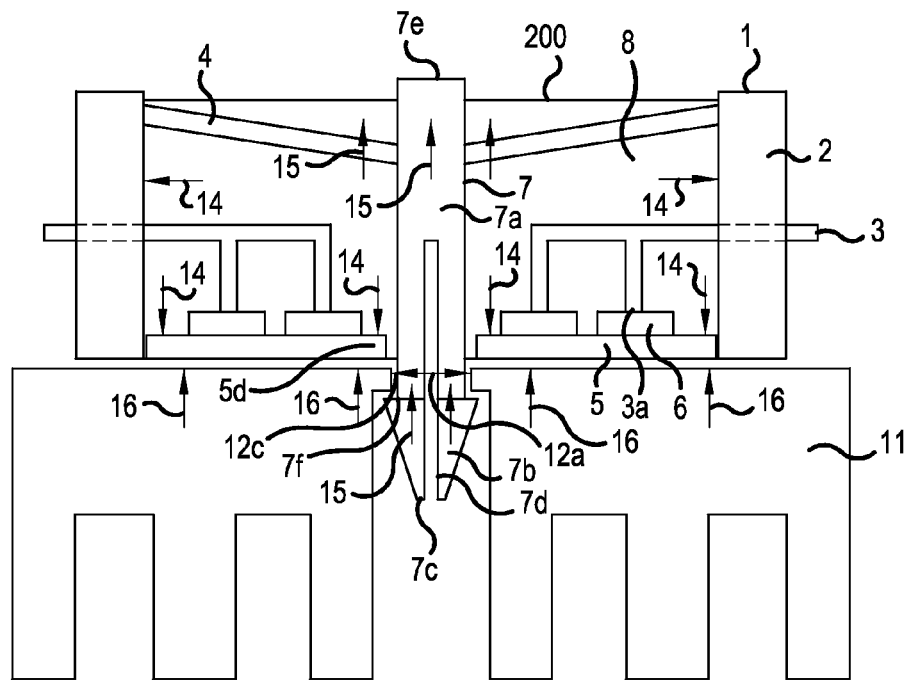

In FIG. 10B, when the force 13 applied to the vertex 7e of the fastener 7 is removed, the beam portion 4 which is distorted downward is raised by a spring action and force to return the beam portion 4 to the original state acts. The force 15 is transmitted to the hook portion 7b provided at the leading end of the fastener 7 and an upper end portion 7f of the hook portion 7b comes into close contact with the bottom 12c of the hole 12a of the cooler 11. Repulsive force 14 generated by the spring action of the beam portion 4 is transmitted to the cooler 11 through the hook portion 7b and the cooler 11 is raised. The insulating substrate 5 with a conductive pattern is pressed by the repulsive force 14 generated by the sealing resin 8. In this way, the semiconductor device 200 comes into close contact with the cooler 11 and is fixed thereto.

In the semiconductor device 200, the force 13 applied to the fastener 7 which is disposed at the center of the terminal case 1 is transmitted to the center of the cooler 11. Then, the force 13 is transmitted to the outer circumferential portion of the cooler 11. Therefore, strong force is applied to a central portion of the contact surface between the semiconductor device 200 and the cooler 11 and weak force is applied to an outer circumferential portion. Since a corner portion 5d (which is disposed in the vicinity of the fastener 7) of each insulating substrate 5 with a conductive pattern which greatly warps is disposed in the central portion to which strong force is applied, the force applied to the central portion is weakened and uniform force is applied to the entire insulating substrate 5 with a conductive pattern.

In addition, since the insulating substrate 5 with a conductive pattern forming the semiconductor device 200 is divided and the insulating substrate 5 with a conductive pattern which is provided in the vicinity of the fastener 7 is raised, it is possible to increase adhesion to the cooler 11. When the adhesion is increased, it is possible to reduce contact thermal resistance between the semiconductor device 200 and the cooler 11. In addition, in the semiconductor device 200, since the fastener 7 is arranged at the center of the terminal case 1 in a plan view, it is possible to reduce the external dimensions of the semiconductor device. In addition, in the semiconductor device 200, since the hook portion 7b is provided in the fastener 7, it is possible to bring the semiconductor device 200 into close contact with the cooler 11 and to fix the semiconductor device 200 to the cooler 11 with a simple structure. Therefore, a screwing operation requiring a lot of time is not required and torque management is not required. As a result, it is possible to reduce manufacturing costs.

Embodiment 4

FIGS. 11A to 13 are cross-sectional views illustrating main manufacturing processes of a semiconductor device manufacturing method according to a fourth embodiment.

Figure 14A:
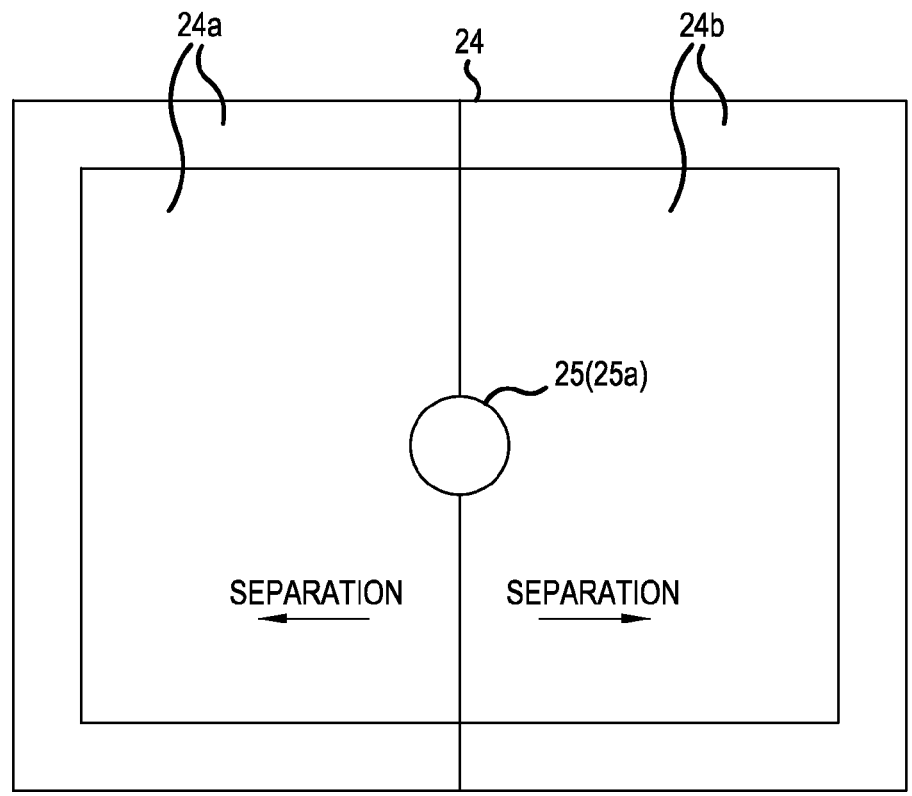
FIGS. 14A and 14B are diagrams illustrating a main portion of the structure of a resin molding jig used in the manufacturing method, where
Figure 14B:
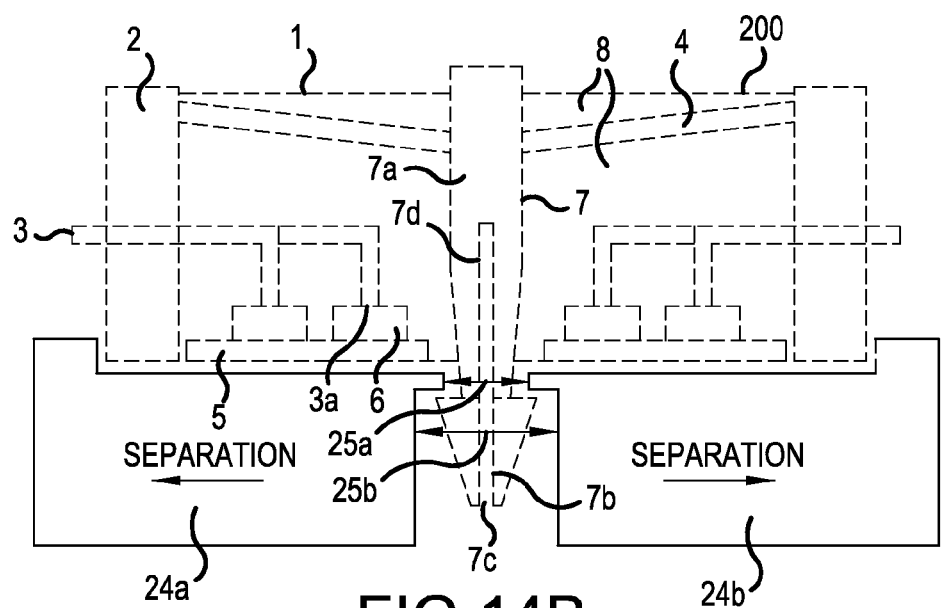

FIG. 14A is a plan view of a main portion of the structure of a resin molding jig used in the manufacturing method and FIG. 14B is a cross-sectional view. FIG. 14B shows a terminal case 1 or an insulating substrate 5 with a conductive pattern for reference.

Figure 11A:
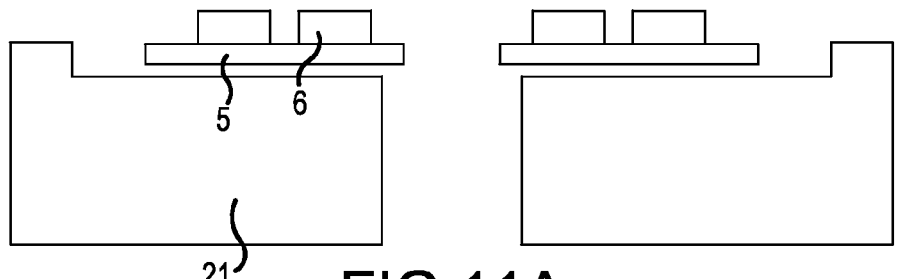
FIGS. 11A, 11B, and 11C are cross-sectional views sequentially illustrating main manufacturing processes of a semiconductor device manufacturing method according to a fourth embodiment.

In FIG. 11A, the insulating substrates 5 with a conductive pattern are place on a solder jig 21. Solder (not shown) is applied onto the insulating substrates 5 (conductive patterns 5a) with a conductive pattern. Semiconductor chips 6 are placed on the applied solder.

Figure 11B:
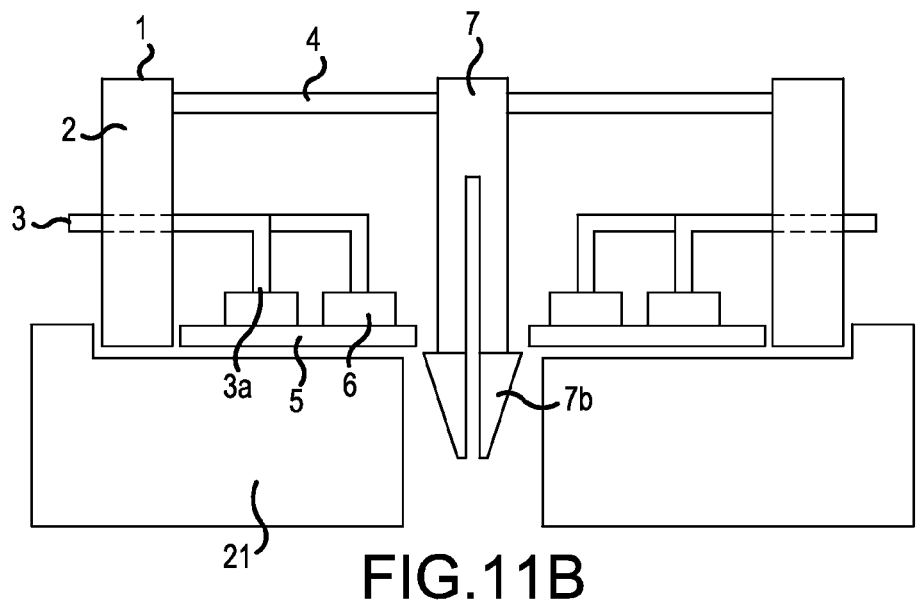

In FIG. 11B, solder (not shown) is applied onto the semiconductor chips 6. The terminal case 1 in which a beam portion 4 and a fastener 7 are integrally molded is provided on the semiconductor chips 6 such that a leading end 3a of a terminal 3 is provided on the semiconductor chip 6. Then, the temperature of the solder jig 21 is increased to melt the solder. Then, the solder jig 21 is cooled to solidify the solder such that the insulating substrates 5 with a conductive pattern are soldered to the semiconductor chips 6 and the semiconductor chips 6 are soldered to the terminals 3 (leading ends 3a).

Figure 11C:
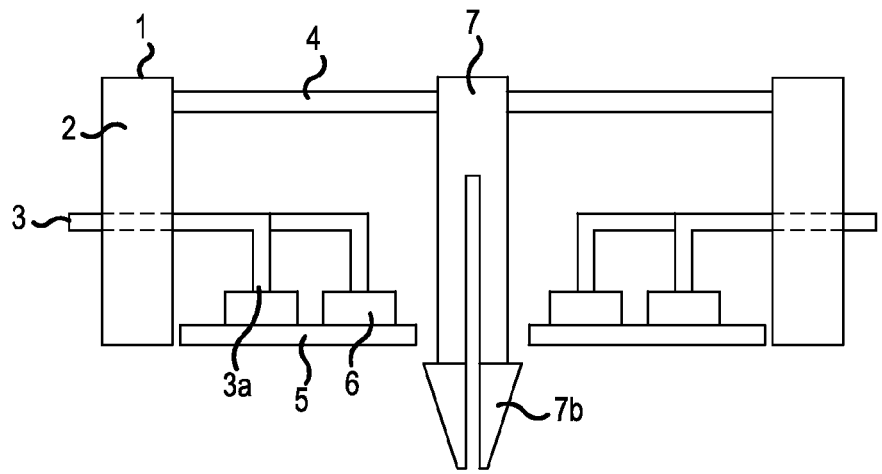

In FIG. 11C, the terminal case 1 in which the terminals 3 (leading ends 3a) are soldered to the semiconductor chips 6 and the semiconductor chips 6 are soldered to the insulating substrates 5 with a conductive pattern is taken off from the solder jig 21.

Figure 12A:
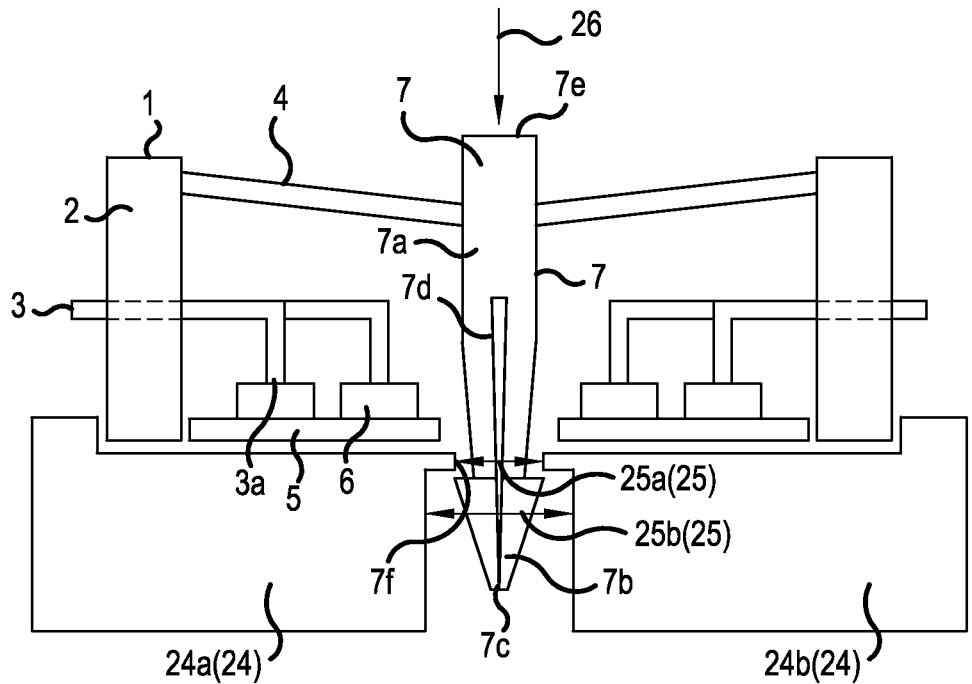
FIGS. 12A and 12B are cross-sectional views sequentially illustrating the main manufacturing processes of the semiconductor device manufacturing method according to the fourth embodiment, which follows FIG. 11B.

In FIG. 12A, the terminal case 1 in which the terminals 3 (leading ends 3a) are soldered to the semiconductor chips 6 and the semiconductor chips 6 are soldered to the insulating substrates 5 with a conductive pattern is placed on a resin molding jig 24. A hole 25 which is formed at the center of the resin molding jig 24 and into which the fastener 7 is inserted has the same structure as an attachment hole 12 which is formed in a cooler 11. However, as shown in FIG. 14, the resin molding jig 24 can be separated into two portions, that is, the right and left portions (a first jig 24a and a second jig 24b).

Then, force 26 is applied to a vertex 7e of a post 7a of the fastener 7 to press the fastener 7 downward. Then, the beam portion 4 is moved down by about 100 μm to 200 μm. A hook portion 7b of the fastener 7 passes through a hole 25a and an upper end portion 7f of the hook portion 7b comes into contact with the bottom 25c of the hole 25a formed in the resin molding jig 24.

Figure 12B:
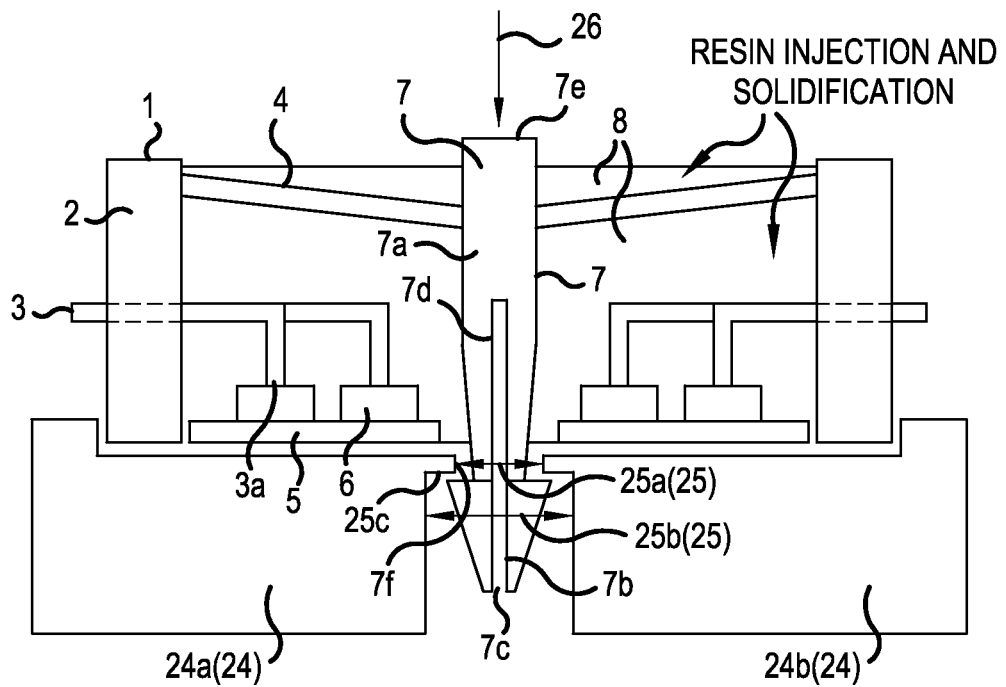

In FIG. 12B, the hook portion 7b passes through the hole 25a and is inserted into a hole 25b. When the hook portion 7b is inserted into the hole 25b, a cutout 7d is spread and the hook portion 7b returns to the original size. With force 26 being applied, a sealing resin 8 is molded in the terminal case 1 and is solidified.

Figure 13:
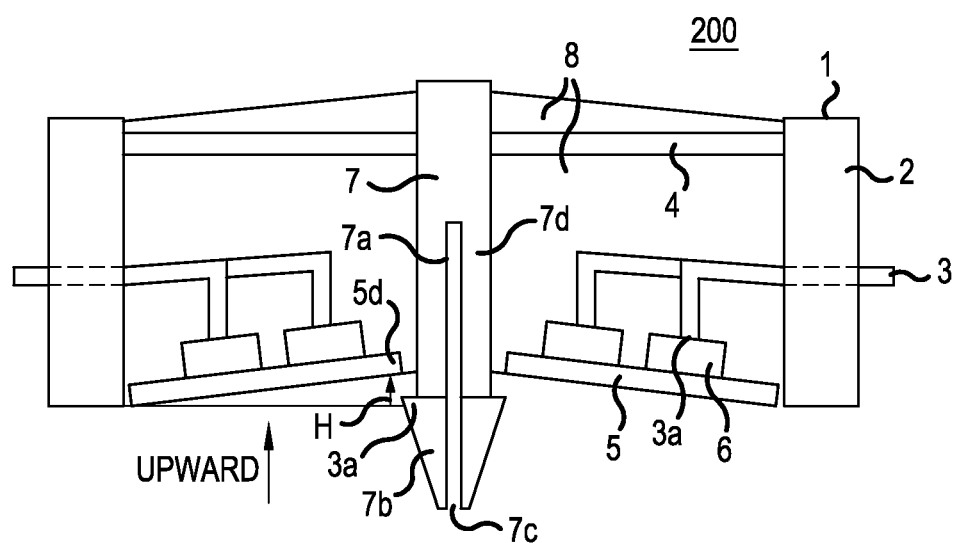
FIG. 13 is a cross-sectional view sequentially illustrating the main manufacturing processes of the semiconductor device manufacturing method according to the fourth embodiment, which follows FIG. 12B.

In FIG. 13, the force 26 (see FIGS. 12A and 12B) is removed and the first jig 24a and the second jig 24b of the resin molding jig 24 shown in FIG. 14A are separated from each other. The terminal case 1 in which the sealing resin 8 is molded and solidified is taken off from the resin molding jig 24. In this case, since the force 26 is removed, the beam portion 4 returns to the original position by a spring action and the fastener 7 is raised. A corner portion 5d of each of the divided insulating substrates 5 with a conductive pattern, which is adjacent to the fastener 7, is raised toward the terminal case 1 by the spring action of the beam portion 4 so as to be higher than a peripheral portion. The raised height H of the corner portion 5d is in the range of about 100 μm to 200 μm (in a floating state).

As such, since the corner portion 5d of each insulating substrate 5 with a conductive pattern, which is arranged in the vicinity of the fastener 7, is raised, it is possible to improve the contact with the cooler 11.

Embodiment 5

Figure 15:
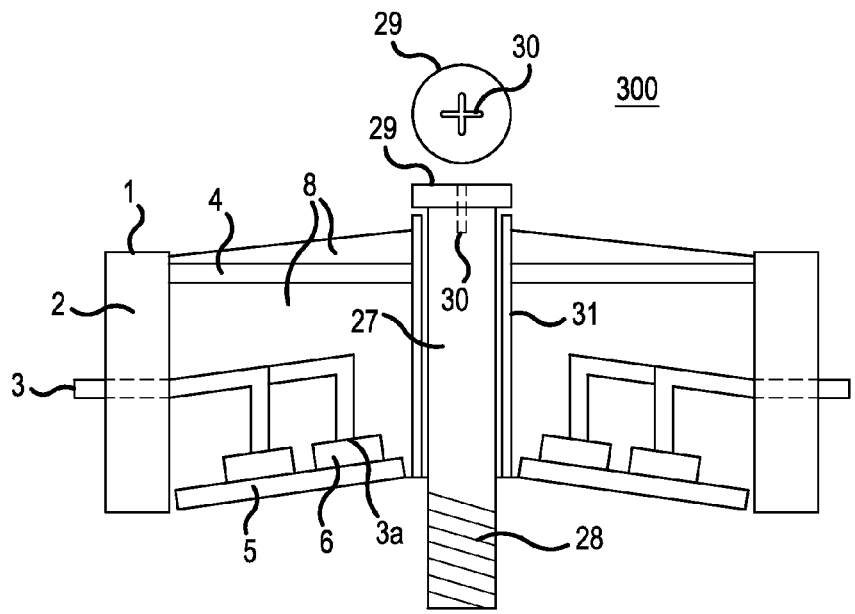
FIG. 15 is a cross-sectional view illustrating a main portion of the structure of a semiconductor device according to a fifth embodiment.

FIG. 15 is a cross-sectional view illustrating a main portion of a semiconductor device according to a fifth embodiment. A semiconductor device 300 differs from the semiconductor device 200 (see FIGS. 7A-C) in that a screw 27 replaces the fastener 7. A screw thread 28 is formed in the screw 27 and a cross slot 30 is formed in the head 29 of the screw 27. The screw 27 is supported by a screw post 31 with a through hole through which the screw 27 passes.

Figure 16:
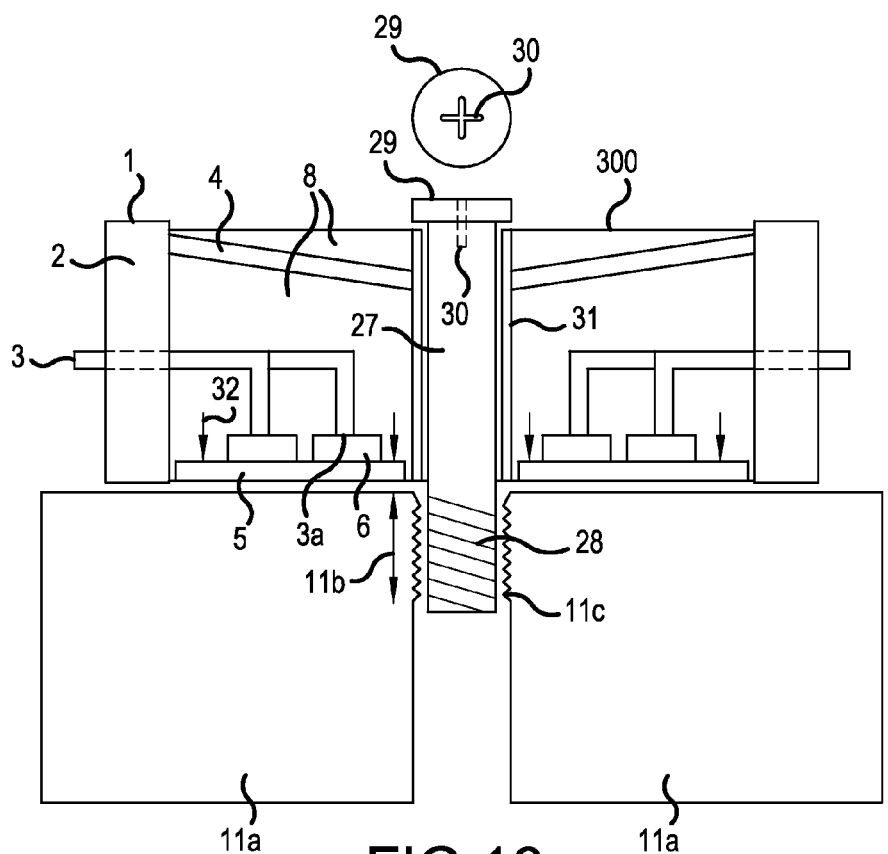
FIG. 16 is a diagram illustrating a main portion when the semiconductor device shown in FIG. 15 is attached to a cooler.

FIG. 16 is a cross-sectional view illustrating the main portion when the semiconductor device shown in FIG. 15 is attached to a cooler. The screw 27 is inserted into a screw receiving portion 11b of a cooler 11a. When the screw 27 is tightened, the beam portion 4 is curved downward. In this case, a sealing resin 8 is interposed and compressed between the beam portion 4 and the insulating substrates 5 with a conductive pattern and presses the insulating substrates 5 with a conductive pattern. The pressing force 32 is used to attach the semiconductor device 300 to the cooler 11a. The screw thread 28 of the screw 27 is engaged with a screw thread 11c of the screw receiving portion 11b and the screw 27 functions as the hook portion 7b. The screw receiving portion 11b is the insertion depth of the screw 27 and the depth is determined such that the repulsive force of the beam portion 4 is appropriate.

The semiconductor device 300 is not fixed to the cooler 11a by the tightening torque of the screw 27, but by the repulsive force of the beam portion 4 arranged in the terminal case 1. Therefore, torque management for screwing is not required, unlike the related art. In this case, the same effect as that in Embodiment 1 is obtained.

Embodiment 6

Figure 17:
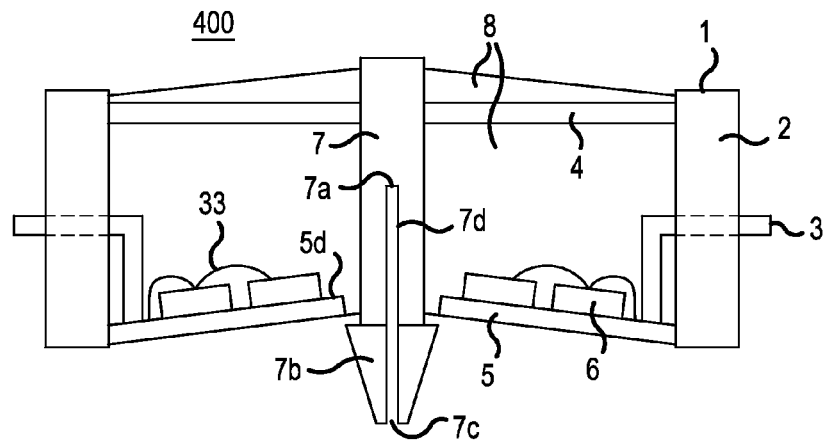
FIG. 17 is a cross-sectional view illustrating a main portion of the structure of a semiconductor device according to a sixth embodiment.
Figure 18A:
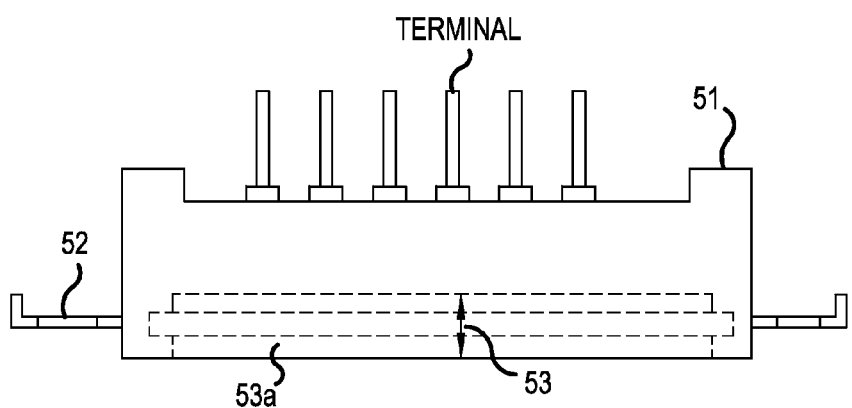
FIGS. 18A and 18B are diagrams illustrating a main portion of the structure of a semiconductor device disclosed in Non-patent Document 1, where
Figure 18B:
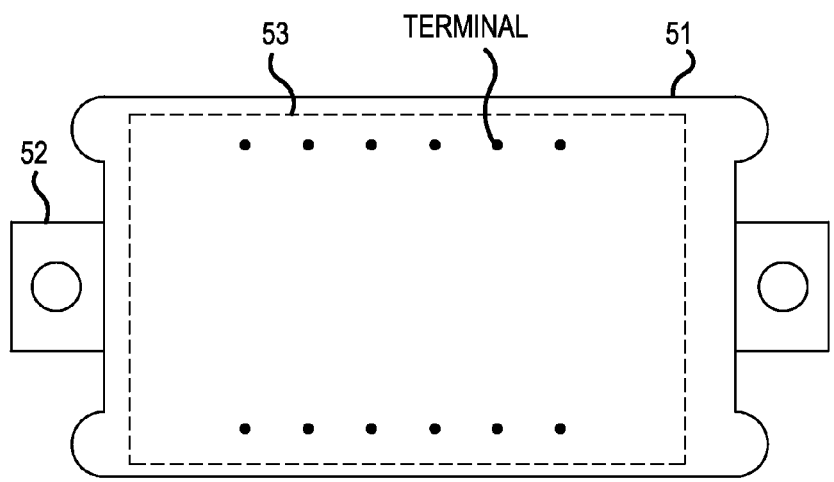
Figure 19A:
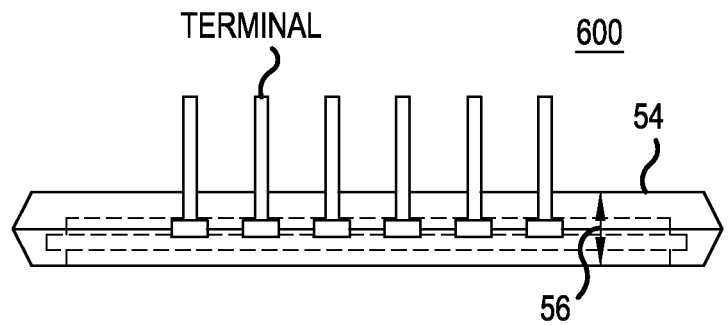
FIGS. 19A and 19B are diagrams illustrating a main portion of the structure of a semiconductor device disclosed in Patent Document 1, where
Figure 19B:
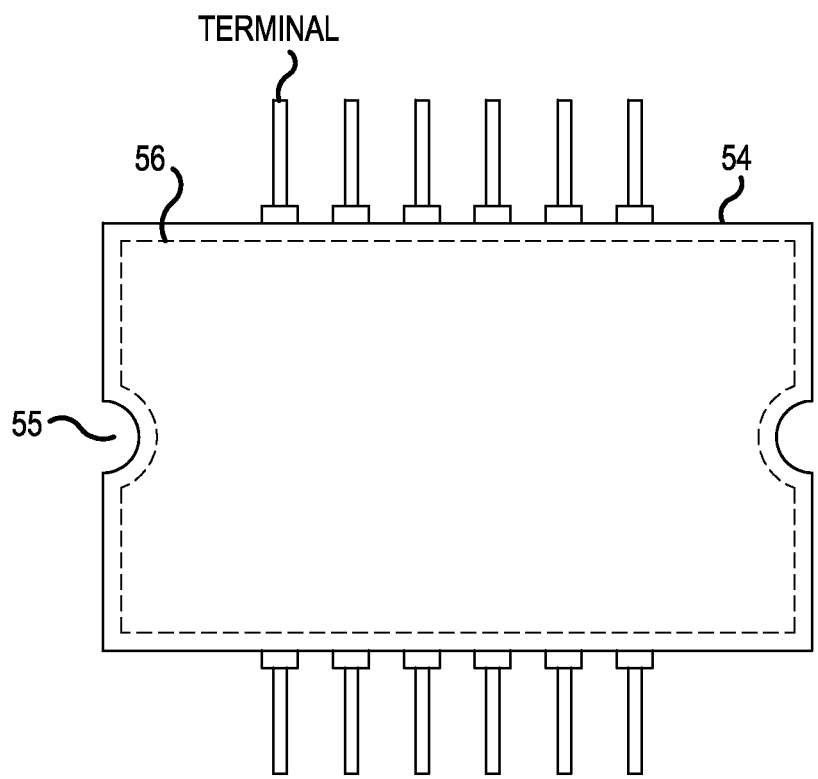
Figure 20A:
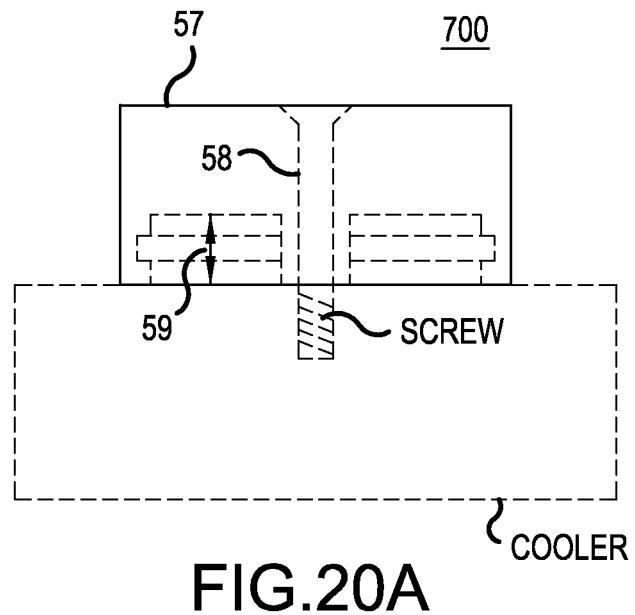
FIGS. 20A and 20B are diagrams illustrating a main portion of the structure of a semiconductor device disclosed in Patent Document 2, where
Figure 20B:
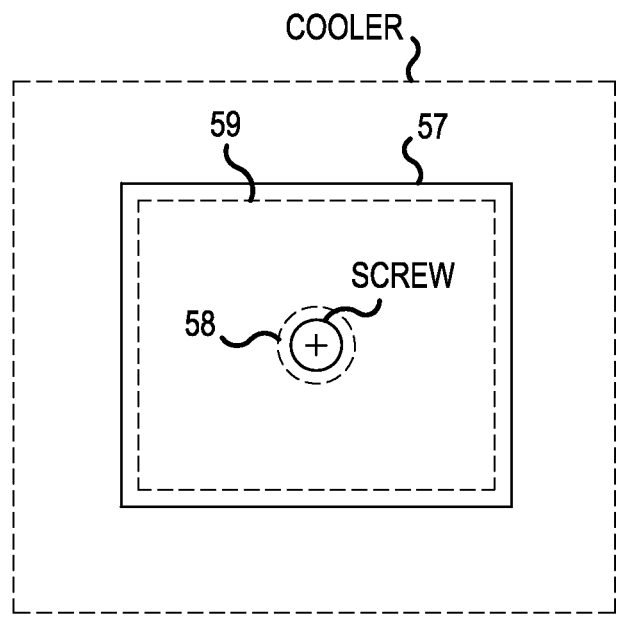
Figure 21:
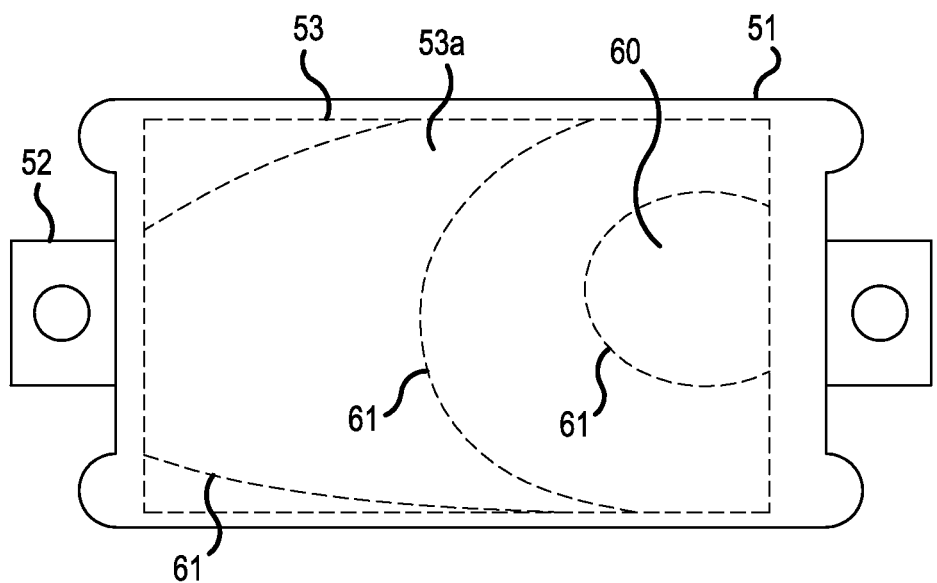
FIG. 21 is a diagram illustrating the warping of a back side conductor shown in FIG. 18.

FIG. 17 is a cross-sectional view illustrating a main portion of a semiconductor device according to a sixth embodiment. A semiconductor device 400 differs from the semiconductor device 200 (see FIGS. 7A-C) in that bonding wires 33 are used as some of the terminals 3 of the terminal case 1. In this embodiment, the bonding wires 33 are used to connect semiconductor chips 6 and to connect the semiconductor chips 6 and insulating substrates 5 (conductive pattern 5a) with a conductive pattern. Since a fastener 7 of the semiconductor device 400 is the same as that in Embodiment 2, the same effect as that in Embodiment 2 is obtained. In some cases, a general case corresponding to an outer frame 2 of the terminal case 1 is used instead of the terminal case 1 used in Embodiment 6 and the terminal 3 which passes through the terminal case 1 is drawn from the upper side of the general case (outer frame 2) to the outside.

The application of the bonding wire 33 is not limited to the semiconductor device 200, but the bonding wire 33 can also be applied to the semiconductor devices 100 and 300.

The above-described Embodiments 1 to 4 are summarized as follows. The semiconductor devices 100 to 400 are manufactured using the terminal case 1, the beam portion 4, which has elasticity and is connected to the terminal case 1, a plurality of divided insulating substrates 5 with a conductive pattern, the fastener 7 which is provided at the center, and the sealing resin 8 which has elasticity and fills the terminal case 1. Therefore, it is possible to improve adhesion to the coolers 11 and 11a and to reduce contact thermal resistance between the semiconductor devices 100 to 400 and the coolers 11 and 11a.

Since a plurality of divided insulating substrates 5 with a conductive pattern are provided, they can be closely attached to the coolers 11 and 11a.

In the semiconductor devices 100, 200, and 400, the hook portion 7b provided at the leading end of the fastener 7 is inserted into the two-stage holes 12a and 12b provided in the cooler 11 only by a one-touch operation of applying the force 13 to the vertex 7e of the fastener 7. Therefore, it is possible to simply attach the semiconductor devices 100, 200, and 400 to the cooler 11. Since the screw 27 of the semiconductor device 300 is used as the hook portion 7b, it is possible to simply attach the semiconductor device 300 to the cooler 11. The attachment does not require a screwing operation unlike the related art and does not also require torque management. Therefore, it is possible to reduce the manufacturing costs of the semiconductor devices 100, 200, and 400.

In Embodiments 1 to 4, the insulating substrate 5 with a conductive pattern comes into close contact with the cooler 11 and is fixed thereto and the dimensions of the semiconductor device can be reduced, which hold for Embodiments 5 and 6.

Only the principle of the invention has been described above. Various modifications and changes of the invention can be made by those skilled in the art. The invention is not limited to the above-mentioned accurate structures and applications and all of the corresponding modifications and equivalents are regarded as the scope of the invention defined by the appended claims and equivalents thereof.

The invention claimed is:

1. A semiconductor device comprising:
a plurality of insulating substrates comprising conductive patterns disposed thereon;
a case accommodating the plurality of insulating substrates such a first side of each of the plurality of insulating substrates is exposed outside the case;
a cooler disposed facing the first side of each of the plurality of insulating substrates;
a beam portion disposed in the case so as to face a second side of each of the plurality of insulating substrates; and
a fastener disposed at a center of the beam portion, and having a leading end disposed in an attachment hole of the cooler such that the beam portion is distorted.

2. The semiconductor device according to claim 1, further comprising:
a sealing resin disposed in the case and in contact with the plurality of insulating substrates and the beam portion.

3. The semiconductor device according to claim 1,
wherein the plurality of insulating substrates surround the fastener.

4. The semiconductor device according to claim 1,
wherein the case, the beam portion, and the fastener are integrally formed of a resin.

5. The semiconductor device according to claim 1,
wherein the fastener comprises a post and a hook portion disposed at an end of the post, and
a cutout is formed in the post and extends from a bottom of the hook portion.

6. The semiconductor device according to claim 1,
wherein the plurality of insulating substrates are formed by radially dividing a large insulating substrate with a conductive pattern.

7. The semiconductor device according to claim 1,
wherein the fastener comprises a screw.

8. The semiconductor device according to claim 2,
wherein the sealing resin comprises an elastic material.

9. The semiconductor device according to claim 3,
wherein at least one insulating substrate among the plurality of insulating substrates is disposed raised toward the beam portion such that a portion of the at least one insulating substrate closer to the fastener is higher than an outer circumferential portion of the at least one insulating substrate closer to the case.

10. A semiconductor device manufacturing method comprising:
placing a plurality of insulating substrates comprising conductive patterns on a jig such that the plurality of insulating substrates surround a hole of the jig and a first side of each of the plurality of insulating substrates having the conductive patterns face the jig; and
covering the plurality of insulating substrates with a terminal case, in which a case accommodating the plurality of insulating substrates such that a first side of each of the plurality of insulating substrates is exposed outside the case, a cooler disposed facing the first side of each of the plurality of insulating substrates, a beam portion disposed in the case so as to face a second side of each of the plurality of insulating substrates, and a fastener disposed at a center of the beam portion, and having a leading end disposed in an attachment hole of the cooler such that the beam portion is distorted are integrally molded, such that the leading end of the fastener is aligned with the central hole of the jig.

11. The semiconductor device manufacturing method according to claim 10, further comprising:
adding a sealing resin to the terminal case and solidifying the sealing resin.

12. The semiconductor device manufacturing method according to claim 11, further comprising:
pressing the center of the beam portion against the jig to insert the leading end of the fastener into an insertion hole of the jig, thereby distorting the beam portion, before adding the sealing resin to the terminal case.

13. The semiconductor device manufacturing method according to claim 12, further comprising:
dividing the jig into two parts, thereby returning the distorted beam portion to the original position, after the beam portion is distorted and the sealing resin is solidified.

14. A semiconductor device comprising:
a plurality of insulating substrates comprising conductive patterns disposed thereon;
a case accommodating the plurality of insulating substrates such a first side of each of the plurality of insulating substrates is exposed outside the case;
a cooler disposed facing the first side of each of the plurality of insulating substrates and comprising a hole, the hole having a first cross-sectional width and a second cross-sectional width greater than the first cross-sectional width;
a beam portion disposed in the case so as to face a second side of each of the plurality of insulating substrates; and
a fastener connected to the beam portion and having an end disposed in the hole, the end having a third cross-sectional width that is greater than the first cross-sectional width and less than the second cross-sectional width.

15. The semiconductor device according to claim 14, wherein the fastener further comprises a groove in the end.

16. The semiconductor device according to claim 15, wherein an upper portion of the end contacts a bottom surface of cooler defining the hole having the first cross-sectional width.

* * * * *